(12) United States Patent
Yokoyama

(10) Patent No.: US 10,796,980 B2
(45) Date of Patent: Oct. 6, 2020

(54) SEMICONDUCTOR DEVICE

(71) Applicant: RENESAS ELECTRONICS CORPORATION, Tokyo (JP)

(72) Inventor: Kanato Yokoyama, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/284,172

(22) Filed: Feb. 25, 2019

(65) Prior Publication Data

US 2019/0304875 A1 Oct. 3, 2019

(30) Foreign Application Priority Data

Mar. 28, 2018 (JP) ................................ 2018-062604

(51) Int. Cl.
| | | |
|---|---|---|
| H01L 23/48 | (2006.01) | |
| H01L 23/52 | (2006.01) | |
| H01L 29/40 | (2006.01) | |
| H01L 23/498 | (2006.01) | |
| H01L 23/538 | (2006.01) | |
| H01L 23/00 | (2006.01) | |

(52) U.S. Cl.
CPC ...... *H01L 23/481* (2013.01); *H01L 23/49827* (2013.01); *H01L 23/5386* (2013.01); *H01L 24/09* (2013.01); *H01L 24/17* (2013.01); *H01L 24/33* (2013.01); *H01L 24/49* (2013.01); *H01L 2224/02372* (2013.01)

(58) Field of Classification Search
USPC ........................................................ 257/774
See application file for complete search history.

(56) References Cited

U.S. PATENT DOCUMENTS

| | | |
|---|---|---|
| 8,247,906 B2 | 8/2012 | Law et al. |
| 2016/0218083 A1* | 7/2016 | Kariyazaki ............. H01L 25/18 |

FOREIGN PATENT DOCUMENTS

JP 2011-014910 A 1/2011

* cited by examiner

*Primary Examiner* — Niki H Nguyen
(74) *Attorney, Agent, or Firm* — McDermott Will & Emery LLP

(57) ABSTRACT

A semiconductor device includes a bypass wiring connected with a first through via and a second through via, on a second surface side of a semiconductor substrate that is an opposite side of a wiring structure formed on a first surface side of the semiconductor substrate.

14 Claims, 20 Drawing Sheets

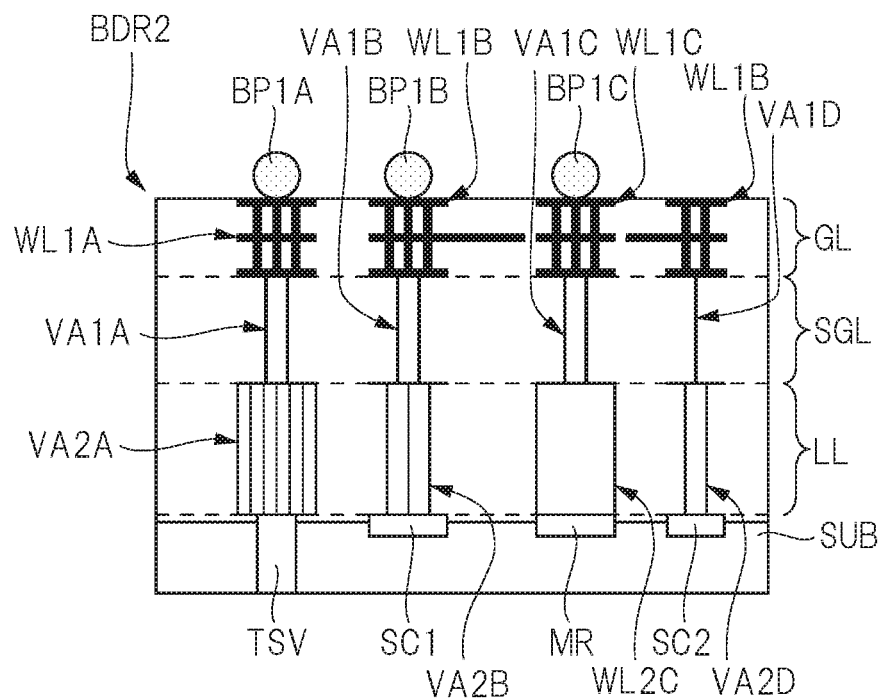
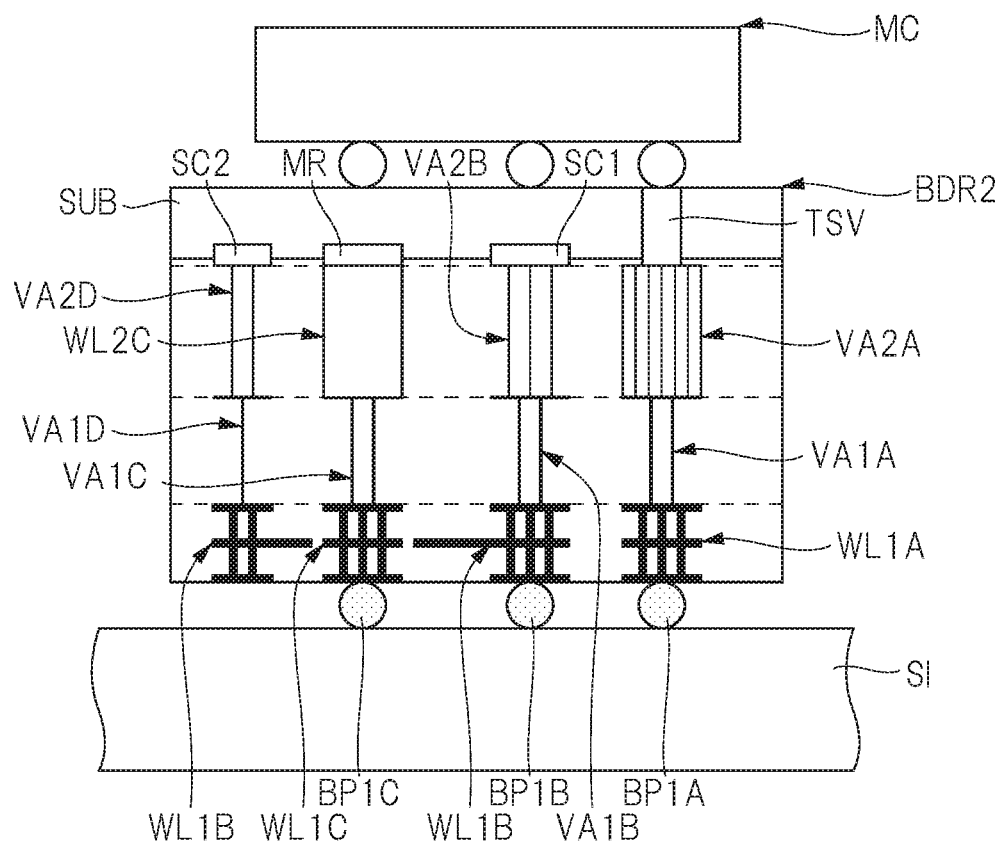

SEMICONDUCTOR DEVICE

CROSS-REFERENCE TO RELATED APPLICATION

The present application claims priority from Japanese Patent Application No. 2018-062604 filed on Mar. 28, 2018, the content of which is hereby incorporated by reference into this application.

TECHNICAL FIELD OF THE INVENTION

The present invention relates to a semiconductor device, for example, a technique effectively applicable to a semiconductor device with through vias.

BACKGROUND OF THE INVENTION

Japanese Unexamined Patent Application Publication No. 2011-14910 (Patent Document 1) discloses a semiconductor device configured to supply a power supply potential from the backside of a semiconductor chip using through vias.

SUMMARY OF THE INVENTION

In recent years, semiconductor chips have been advancing in functionality. For realizing the higher functionality of semiconductor chips, wiring resources formed in the semiconductor chips are required to be allocated to multiple circuits. As a result, wiring resource shortage becomes apparent as the functionality of the semiconductor chips advances. In order to prevent the wiring resource shortage, miniaturization of individual wirings is necessary, and this results in concern over an increase in wiring resistance. Therefore, in order to promote the high functionality of the semiconductor chips, some contrivance is desired to suppress the increase in wiring resistance due to the wiring resource shortage.

Other problems and novel features will be apparent from the description of the present specification and the accompanying drawings.

In a semiconductor device of one embodiment, a bypass wiring connected with a first through via and a second through via is formed on a second surface side of a semiconductor substrate that is an opposite side of a wiring structure formed on a first surface of the semiconductor substrate.

According to one embodiment, the performance of the semiconductor device can be improved.

BRIEF DESCRIPTIONS OF THE DRAWINGS

FIG. 6 is a diagram illustrating a second related art of the base chip;

FIG. 7 is a diagram showing a configuration example in which the base chip of the second related art is arranged on an interposer;

DESCRIPTIONS OF THE PREFERRED EMBODIMENTS

Figure 1:
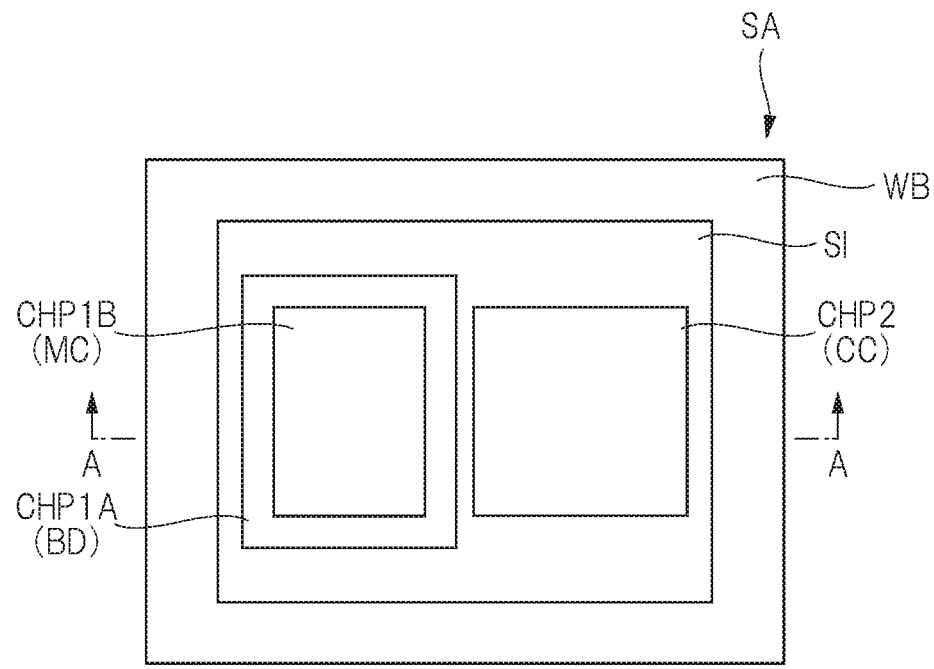
FIG. 1 is a top view of a semiconductor device according to a first embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when mentioning the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, the same members are denoted by the same reference characters in principle throughout the drawings for describing the embodiments, and the repetitive description thereof is omitted. In addition, hatching is used even in a plan view so as to make the drawings easy to see.

First Embodiment

In a first embodiment, a mode in which a plurality of semiconductor chips are mounted on a silicon interposer having a plurality of wiring layers formed on a silicon substrate will be described as an example of a semiconductor device in which a plurality of semiconductor components are electrically connected to each other via an interposer. More specifically, the semiconductor device illustratively described in the first embodiment includes a memory chip formed with a memory circuit and a logic chip formed with a control circuit for controlling the memory chip and an arithmetic processing circuit. The memory chip is electrically connected with the logic chip via the silicon interposer, and a system is formed in one package. Such a semiconductor device with a system formed in one package is referred to as a SiP (System in Package). Also, a semiconductor device having a plurality of semiconductor chips mounted in one package is referred to as a MCM (Multi Chip Module).

Summary of the Semiconductor Device

With reference to the drawings, the summary of the structure of the semiconductor device according to the first embodiment will be described first.

FIG. 1 is a top view of the semiconductor device according to the first embodiment. As shown in FIG. 1, a semiconductor device SA according to the first embodiment includes a wiring board WB, an interposer SI mounted on the wiring board WB, semiconductor chips CHP1A and CHP1B mounted in a laminated manner on the interposer SI, and a semiconductor chip CHP2 mounted apart from the semiconductor chips CHP1A and CHP1B mounted in a laminated manner on the interposer SI. The semiconductor chips CHP1A and CHP2 are aligned with each other on the interposer SI, and the plurality of semiconductor chips CHP1B are arranged in a laminated manner on the semiconductor chip CHP1A.

As shown in FIG. 1, the wiring board WB has a square outer shape in a plan view. The interposer SI also has a square outer shape in a plan view, and the semiconductor chips CHP1A, CHP1B, and CHP2 further have a square outer shape in a plan view.

In the example shown in FIG. 1, the semiconductor chip CHP1A is a base chip BD having a function of controlling a memory circuit, and each of the plurality of semiconductor chips CHP1B is a memory chip MC having a memory circuit. Meanwhile, the semiconductor chip CHP2 is a logic chip CC having a control circuit for controlling the memory circuit. In the example of FIG. 1, each of the base chip BD and the logic chip CC is directly connected with the interposer SI. In other words, none of a substrate nor other chip components is interposed between the base chip BD and the interposer SI and between the logic chip CC and the interposer SI.

Figure 2:
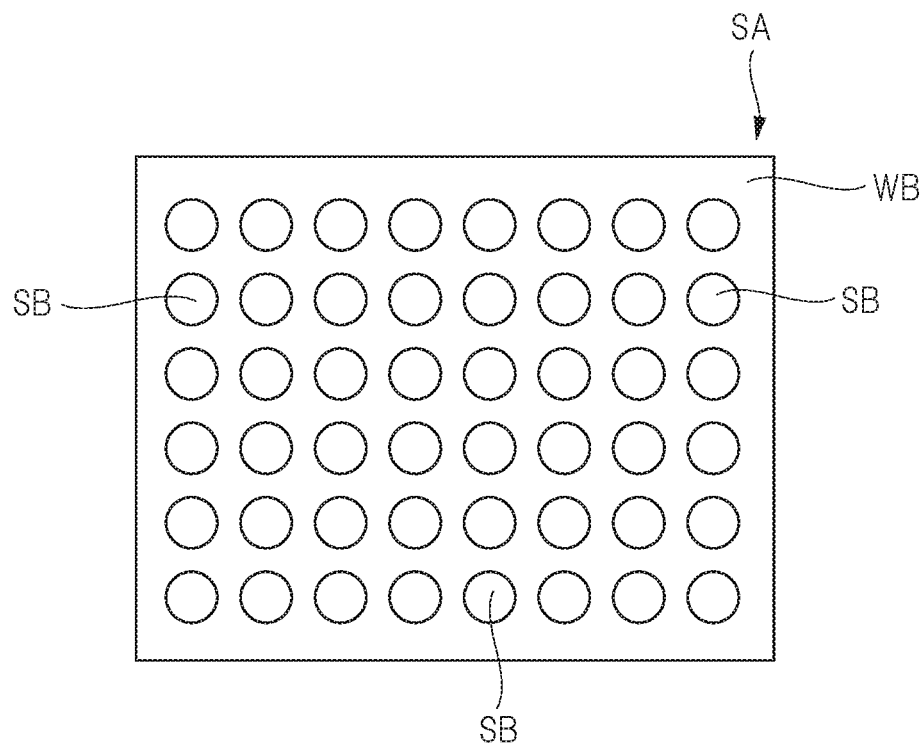
FIG. 2 is a bottom view of the semiconductor device shown in FIG. 1.

Next, FIG. 2 is a bottom view of the semiconductor device shown in FIG. 1. As shown in FIG. 2, a plurality of solder balls SB that are external terminals are arranged in a matrix on the bottom surface of the wiring board WB that is a mounting surface of the semiconductor device SA. Each of the plurality of solder balls SB is connected with land (not shown) formed on the wiring board WB.

A semiconductor device with a plurality of solder balls SB arranged in a matrix on a mounting surface like the semiconductor device SA is referred to as an area array type semiconductor device. In this area array type semiconductor device SA, the mounting surface (bottom surface) of the wiring board WB can be effectively used as an arrangement space of the external terminals (solder balls SB). Therefore, the area array type semiconductor device SA is useful in suppressing an increase in a mounting area of the semiconductor device SA even when the number of external terminals increases. That is, the area array type semiconductor device SA is excellent in that the increased number of external terminals can be mounted in a small space even when the number of external terminals increases due to the higher functionality and integration in the semiconductor device.

Figure 3:
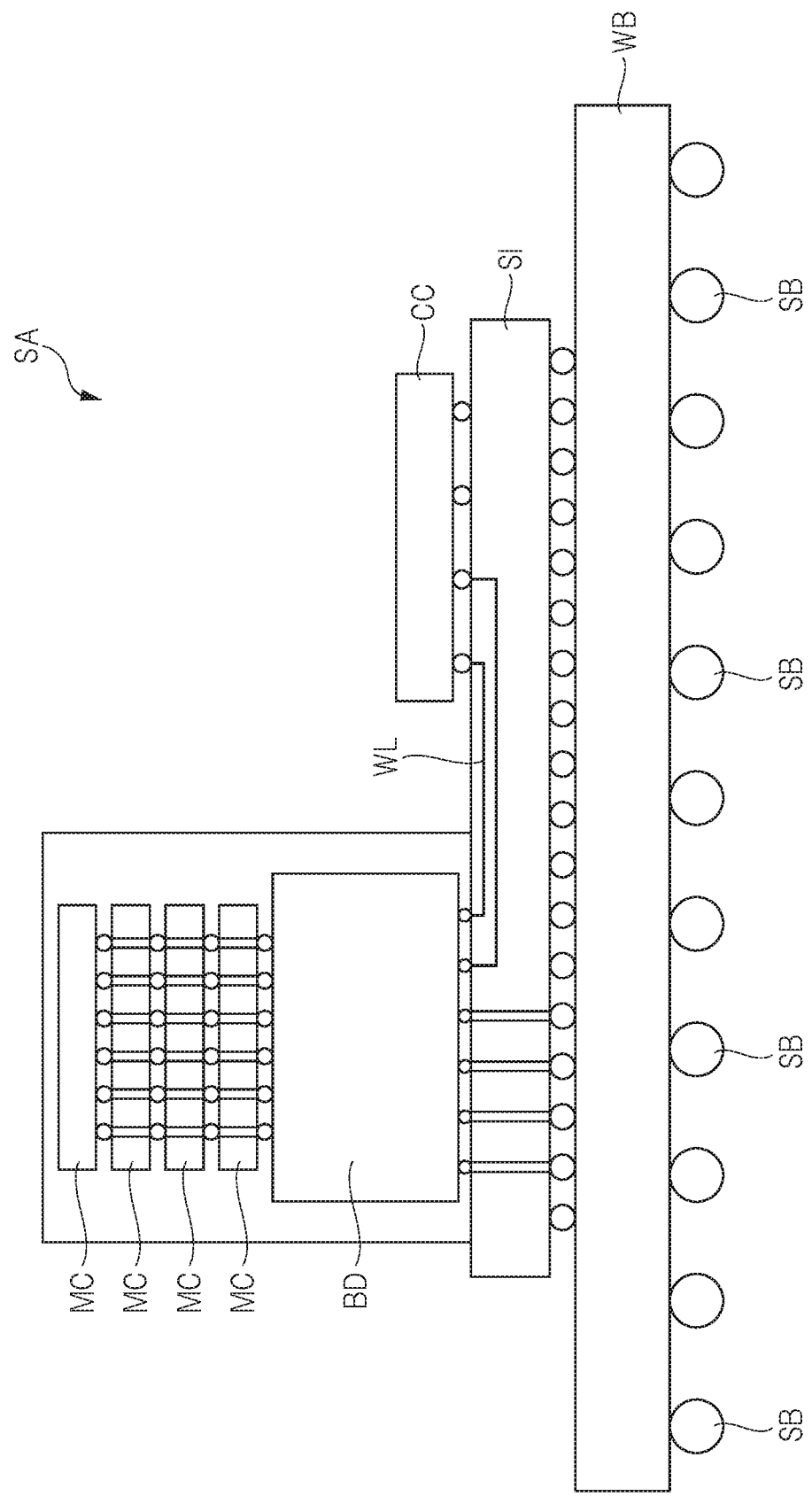
FIG. 3 is a cross-sectional view taken along a line A-A in FIG. 1.

Next, FIG. 3 is a cross-sectional view taken along a line A-A in FIG. 1. In FIG. 3, the wiring board WB includes a top surface on which the base chip BD, the plurality of memory chips MC, and the logic chip CC are mounted via the interposer SI, a bottom surface opposite to the top surface, and side surfaces arranged between the top surface and the bottom surface. As shown in FIG. 3, the interposer SI includes a top surface on which the base chip BD, the plurality of memory chips MC, and the logic chip CC are mounted, a bottom surface opposite to the top surface, and side surfaces arranged between the top surface and the bottom surface. As further shown in FIG. 3, the base chip BD and each of the plurality of memory chips MC have a front surface, a back surface opposite to the front surface, and side surfaces positioned between the front surface and the back surface. Similarly, the logic chip CC has a front surface, a back surface opposite to the front surface, and side surfaces positioned between the front surface and the back surface.

The interposer SI is arranged on the top surface of the wiring board WB, the base chip BD is arranged on the top surface of the interposer SI, and the plurality of memory chips MC are mounted in a laminated manner on the base chip BD. Further, on the top surface of the interposer SI, the logic chip CC is also mounted apart from the base chip BD and the plurality of memory chips MC laminated on the base chip BD. As shown in FIG. 3, a plurality of wirings WL are formed in the interposer SI, and the plurality of memory chips MC are electrically connected with the logic chip CC via the plurality of wirings WL formed in the interposer SI.

Description of a First Related Art

Next, for example, a related art of a base chip will be described.

The term "related art" mentioned in the present specification means a technique having a problem newly found by the inventor and does not mean a known conventional art, but is a technique described with the intention for a background art of a novel technical idea (unknown art).

Figure 4:
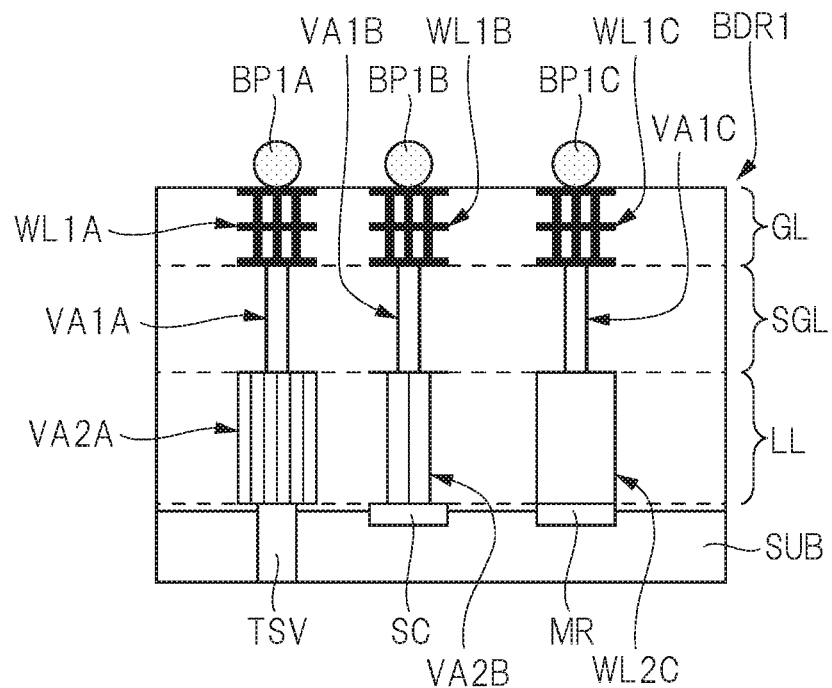
FIG. 4 is a diagram illustrating a first related art of a base chip.

FIG. 4 is a diagram illustrating a first related art of a base chip BDR1. In FIG. 4, the base chip BDR1 of the first related art includes a semiconductor substrate SUB and a through via TSV passing through the semiconductor substrate SUB is formed in the semiconductor substrate SUB. On the first surface side (front surface side) of the semiconductor substrate SUB, for example, a standard cell SC and a macro MR are formed. In this case, the macro MR is a circuit with a special function different from the standard cell SC, and is composed of, for example, an analog circuit, SRAM (Static Random Access Memory), etc. Therefore, the macro MR operates with a power supply potential different from that of the standard cell SC. This requires the base chip BDR1 to be supplied with a plurality of power supply potentials different from each other.

Next, as shown in FIG. 4, a wiring structure is formed over the first surface of the semiconductor substrate SUB on which the standard cell SC and the macro MR are formed. Specifically, this wiring structure is composed of, for example, a local writing layer LL, a semi-global wiring layer SGL formed on the local wiring layer LL, and a global wiring layer GL formed on the semi-global wiring layer SGL. The global wiring layer GL includes wiring with the smallest sheet resistance value in the wiring structure described above. Meanwhile, the semi-global wiring layer SGL includes wiring with a sheet resistance value greater than that of the wiring included in the global wiring layer GL. Further, the local wiring layer LL includes wiring with a sheet resistance value greater than that of the wiring included in the semi-global wiring layer SGL. In addition, as shown in FIG. 4, a bump electrode BP1A, a bump electrode BP1B, and a bump electrode BP1C are mounted on the global wiring layer GL.

Specifically, the bump electrode BP1A is electrically connected with wiring WL1A included in the global wiring layer GL, and the wiring WL1A is electrically connected with a via VA1A included in the semi-global wiring layer SGL. Further, the via VA1A is electrically connected with a via VA2A included in the local wiring layer LL, and the via VA2A is electrically connected with a through via TSV passing through the semiconductor substrate SUB. In this way, a potential supplied to the bump electrode BP1A is supplied to the through via TSV via the wiring WL1A and the vias VA1A and VA2A.

On the other hand, the bump electrode BP1B is electrically connected with wiring WL1B included in the global wiring layer GL, and the wiring WL1B is electrically connected with a via VA1B included in the semi-global wiring layer SGL. Further, the via VA1B is electrically connected with a via VA2B included in the local wiring layer LL, and the via VA2B is electrically connected with the standard cell SC formed on the semiconductor substrate SUB. In this way, a potential supplied to the bump electrode BP1B is supplied to the standard cell SC via the wiring WL1B and the vias VA1B and VA2B.

Also, the bump electrode BP1C is electrically connected with wiring WL1C included in the global wiring layer GL, and the wiring WL1C is electrically connected with a via VA1C included in the semi-global wiring layer SGL. Further, the via VA1C is electrically connected with wiring WL2C included in the local wiring layer LL, and the wiring WL2C is electrically connected with the macro MR formed on the semiconductor substrate SUB. In this way, a potential supplied to the bump electrode BP1C is supplied to the macro MR via the wiring WL1C, the via VA1C, and the wiring WL2C.

Figure 5:
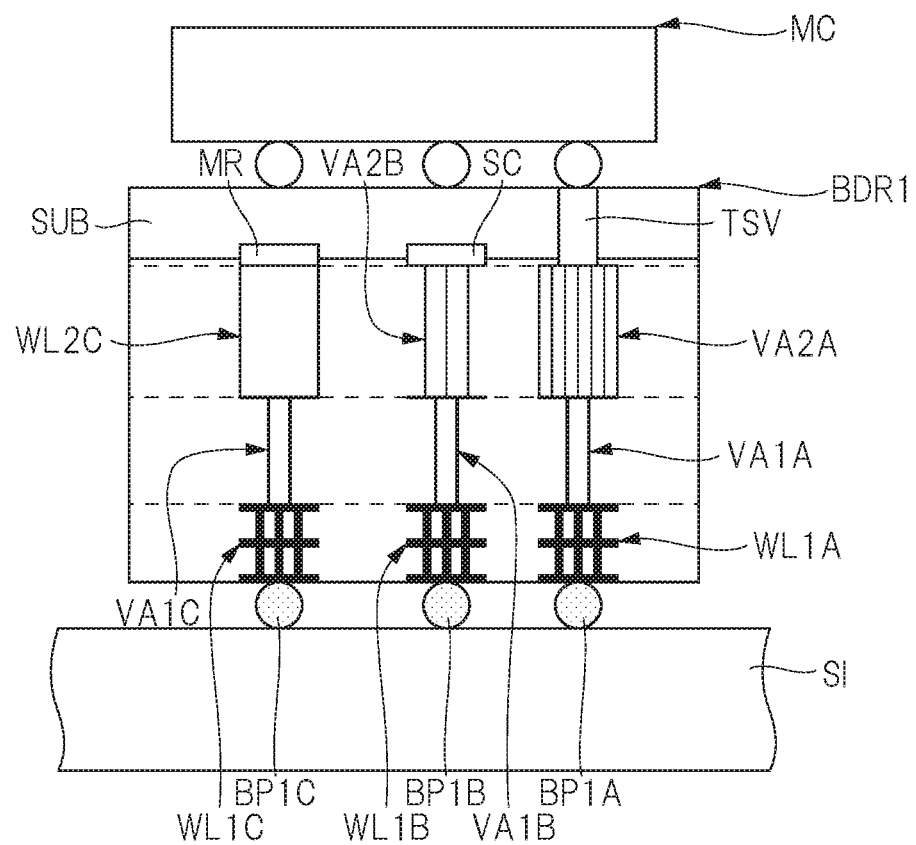
FIG. 5 is a diagram showing a configuration example in which the base chip of the first related art is arranged on an interposer.

The base chip BDR1 of the first related art is configured as described above. Next, FIG. 5 is a diagram showing a configuration example in which the base chip BDR1 of the first related art is arranged on an interposer SI. In FIG. 5, the base chip BDR1 is mounted on the interposer SI. Specifically, the base chip BDR1 is mounted on the interposer SI via the bump electrodes BP1A to BP1C formed on the base chip BDR1. In addition, as shown in FIG. 5, the memory chip MC is mounted on the base chip BDR1. In this case, the through via TSV formed in the base chip BDR1 is electrically connected with a bump electrode of the memory chip MC.

Here, the standard cell SC and the macro MR formed in the base chip BDR1 operate with power supply potentials different from each other. Therefore, in the base chip BDR1 shown in FIGS. 4 and 5, the standard cell SC and the macro MR are electrically connected with bump electrodes to which respectively different power supply potentials are supplied. Namely, the standard cell SC is electrically connected with the bump electrode BP1B, while the macro MR is electrically connected with the bump electrode BP1C. That is, in the base chip BDR1 of the first related art, a power supply potential for operating the standard cell SC is supplied from the bump electrode BP1B provided in a position planarly overlapping a standard cell forming region where the standard cell SC is formed. Similarly, in the base chip BDR1 of the first related art, a power supply potential for operating the macro MR is supplied from the bump electrode BP1C provided in a position planarly overlapping a macro forming region where the macro MR is formed. Also, in the base chip BDR1 of the first related art, the memory chip MC is configured such that a power supply potential is supplied via the through via TSV from the bump electrode BP1A provided in a position planarly overlapping a through via forming region where the through via TSV is formed.

In this case, the arrangement positions of the bump electrodes BP1A to BP1C formed on the base chip BDR1 are often determined in advance by specification. Also, when the standard cell SC and the macro MR, which operate with respectively different power supply potentials, are formed in the base chip BDR1, for example, it is necessary that the bump electrode BP1B to which a power supply potential for operating the standard cell SC is supplied is electrically connected with the standard cell SC and that the bump electrode BP1C to which a power supply potential for operating the macro MR is supplied is electrically connected with the macro MR. In this regard, for example, in the first related art shown in FIGS. 4 and 5, with respect to the bump electrodes BP1A to BP1C arranged in positions determined in advance by specification, the standard cell forming region is provided in a position planarly overlapping the bump electrode BP1B, and the macro forming region is provided in a position planarly overlapping the bump electrode BP1C. In this case, routing of the wiring in the wiring structure is simplified, and thus wiring resources in the wiring structure can be used efficiently. In other words, by providing the standard cell forming region where the standard cell SC is formed and the macro forming region where the macro MR is formed so as to correspond to the arrangement positions of the bump electrodes BP1A to BP1C determined in advance by specification as with the configuration of the base chip BDR1 in the first related art, wiring resources in the wiring structure can be used efficiently. On the other hand, in the first related art, since the standard cell forming region where the standard cell SC is formed and the macro forming region where the macro MR is formed are determined so as to correspond to the arrangement positions of the bump electrodes BP1A to BP1C determined in advance by specification, flexibility of a layout arrangement of the standard cell SC and the macro MR decreases. This means that optimization of the layout arrangement to improve circuit characteristics is difficult in the first related art.

Specifically, for example, even when circuit characteristics represented by electric power, timing, etc. can be improved by a layout in which a portion of the standard cell is arranged in a position not planarly overlapping the bump electrode BP1B, the circuit characteristics may rather decrease because an increase in wiring resistance (sheet resistance) due to wiring resource shortage in the wiring structure becomes apparent. This will be discussed below by using a second related art.

Description of a Second Related Art

FIG. 6 is a diagram illustrating a second related art of a base chip BDR2. Also, in the base chip BDR2 of FIG. 6, arrangement positions of the bump electrodes BP1A to BP1C are determined in advance by specification. Namely, a through via forming region where the through via TSV is formed is provided in a position planarly overlapping the bump electrode BP1A, a first standard cell forming region where a standard cell SC1 is formed is provided in a position planarly overlapping the bump electrode BP1B, and a macro forming region where the macro MR is formed is provided in a position planarly overlapping the bump electrode BP1C. However, in the second related art shown in FIG. 6, a second standard cell forming region where a standard cell SC2 is formed is further provided in a position not planarly overlapping the bump electrode BP1B.

Next, FIG. 7 is a diagram showing a configuration example in which the base chip BDR2 of the second related art is arranged on the interposer SI. In FIG. 7, the base chip BDR2 is mounted on the interposer SI. Specifically, the base chip BDR2 is mounted on the interposer SI via the bump electrodes BP1A to BP1C formed on the base chip BDR2. In addition, as shown in FIG. 7, the memory chip MC is mounted on the base chip BDR2. In this case, a through via TSV formed in the base chip BDR2 is electrically connected with a bump electrode of the memory chip MC.

In the base chip BDR2 configured in such a manner in the second related art, for example, the second standard cell forming region where the standard cell SC2 is formed is provided in the position not planarly overlapping the bump electrode BP1B as shown in FIG. 6. In this regard, it is conceivable that, in order to supply a power supply potential for operating the standard cell SC2 to the standard cell SC2 arranged in the position not planarly overlapping the bump electrode BP1B, an additional bump electrode may be newly arranged in a position planarly overlapping the second standard cell forming region where the standard cell SC2 is formed. Further, it is conceivable that the newly added bump electrode may be electrically connected with the standard cell SC2 to supply the power supply potential for operating the standard cell SC2 to the standard cell SC2. However, this is not permitted because the new bump electrode is arranged in a position other than the position determined by specification.

That is, for example, when a layout in which the standard cell SC2 is arranged in the position not planarly overlapping the bump electrode BP1B is adopted in order to improve the circuit characteristics represented by electric power, timing, etc., a new additional bump electrode cannot be arranged in the position planarly overlapping the second standard cell forming region where the standard cell SC2 is formed. For this reason, in the second related art of FIG. 6, the wiring WL1B in the global wiring layer GL connected with the bump electrode BP1B is extended to a position above the second standard cell forming region where the standard cell SC2 is formed. Then, the extended wiring WL1B is connected with a via VA1D included in the semi-global wiring layer SGL, the via VA1D is connected with a via VA2D included in the local wiring layer LL, and the via VA2D is connected with the standard cell SC2. In this manner, according to the second related art, a power supply potential supplied to the bump electrode BP1B can be supplied to the standard cell SC2 formed in the second standard cell forming region via the extended wiring WL1B, the via VA1D, and the via VA2D.

In the second related art, as shown in FIG. 6, the standard cell SC2 is arranged in the position not planarly overlapping the bump electrode BP1B, and the power supply potential for operating the standard cell SC2 is supplied to the standard cell SC2. Therefore, in the second related art, the wiring WL1B constituting the global wiring layer GL is extended to electrically connect the bump electrode BP1B with the standard cell SC2. In this case, as shown in FIG. 6, the wiring WL1B is extended across the wiring WL1C in the global wiring layer GL. This means that wiring resources in the global wiring layer GL are used dividedly for the extension of the wiring WL1B and the wiring WL1C. The wiring resources here are defined by wiring density rules included in design rules of a semiconductor process and are adjusted by wiring width, wiring intervals, the number of wires, etc. Therefore, when division of wiring resources occurs as with the second related art of FIG. 6, a wiring congestion degree increases and wiring width decreases, resulting in an increase in a wiring resistance value (sheet resistance value) of the extended wiring WL1B. Further, when the wiring resistance value of the extended wiring WL1B increases, a decrease in a power supply potential (power source drop) becomes apparent, and a power supply potential sufficient for secure operation may not be supplied to the standard cell SC2. Therefore, in the configuration of the second related art, in order to improve the circuit characteristics represented by electric power, timing, etc., the layout arrangement in which the standard cell SC2 is arranged in the position not planarly overlapping the bump electrode BP1B cannot be adopted. In other words, in the second related art, even when the layout arrangement capable of improving the circuit characteristics represented by electric power, timing, etc. is intended to be adopted, the circuit characteristics may rather decrease because the increase in a wiring resistance value (sheet resistance value) due to the wiring resource shortage in the wiring structure becomes apparent. Namely, in the second related art described above, the design flexibility of a floor plan is likely to be restricted because the increase in a wiring resistance value (sheet resistance value) due to the wiring resource shortage in the wiring structure becomes apparent and the layout arrangements of the standard cell and the macro are restricted.

Thus, in the first embodiment, a contrivance is provided to suppress side effects represented by the increase in a wiring resistance value due to the wiring resource shortage in the wiring structure while maintaining the flexibility of the layout arrangement for improving the circuit characteristics. Hereinafter, the technical idea of the first embodiment provided with this contrivance will be described.

Configuration of the Semiconductor Device in the First Embodiment

Figure 8:
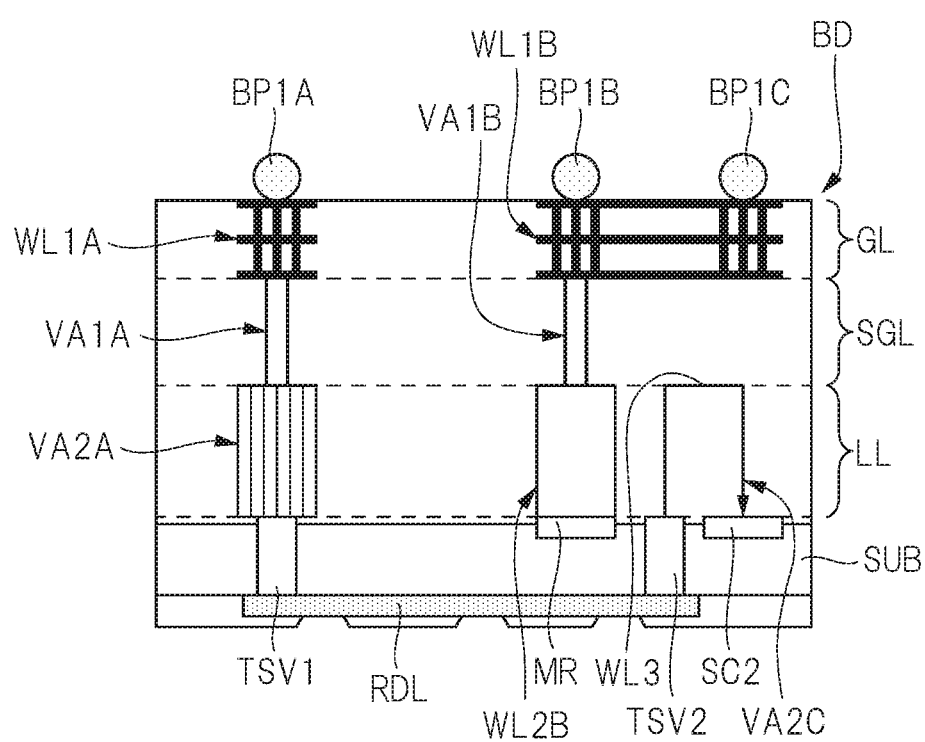
FIG. 8 is a diagram showing a schematic configuration of the base chip according to the first embodiment.

FIG. 8 is a diagram showing a schematic configuration of the base chip BD according to the first embodiment. In FIG. 8, the base chip BD according to the first embodiment includes the semiconductor substrate SUB and the through vias TSV1 and TSV2 passing through the semiconductor substrate SUB are formed in the semiconductor substrate SUB. Also, for example, the standard cell SC2 and the macro MR are formed on the first surface (front surface) of the semiconductor substrate SUB. In this case, the macro MR is a circuit with a special function different from the standard cell SC2 and is composed of, for example, an analog circuit, SRAM (Static Random Access Memory), etc. Therefore, the macro MR operates with a power supply potential different from that of the standard cell SC2. This requires the base chip BD to be supplied with a plurality of power supply potentials different from each other.

Also, as shown in FIG. 8, a wiring structure is formed over the first surface of the semiconductor substrate SUB on which the standard cell SC2 and the macro MR are formed. Specifically, this wiring structure is composed of, for example, a local writing layer LL, a semi-global wiring layer SGL formed on the local wiring layer LL, and a global wiring layer GL formed on the semi-global wiring layer SGL. The global wiring layer GL includes wiring with the smallest sheet resistance value in the wiring structure described above. Meanwhile, the semi-global wiring layer SGL includes wiring with a sheet resistance value greater than that of the wiring included in the global wiring layer GL. Further, the local wiring layer LL includes wiring with a sheet resistance value greater than that of the wiring included in the semi-global wiring layer SGL. In addition, as shown in FIG. 8, a bump electrode BP1A, a bump electrode BP1B, and a bump electrode BP1C are mounted on the global wiring layer GL.

Specifically, the bump electrode BP1A is electrically connected with wiring WL1A included in the global wiring layer GL, and the wiring WL1A is electrically connected with a via VA1A included in the semi-global wiring layer SGL. Further, the via VA1A is electrically connected with a via VA2A included in the local wiring layer LL, and the via VA2A is electrically connected with a through via TSV1 passing through the semiconductor substrate SUB. In this way, a potential supplied to the bump electrode BP1A is supplied to the through via TSV1 via the wiring WL1A and the vias VA1A and VA2A.

On the other hand, the bump electrode BP1B and the bump electrode BP1C are electrically connected with wiring WL1B included in the global wiring layer GL, and the wiring WL1B is electrically connected with a via VA1B included in the semi-global wiring layer SGL. Further, the via VA1B is electrically connected with a wiring WL2B included in the local wiring layer LL, and the wiring WL2B is electrically connected with the macro MR formed on the semiconductor substrate SUB. In this way, a potential supplied to the bump electrode BP1B and the bump electrode BP1C is supplied to the macro MR via the wiring WL1B, the via VA1B, and the wiring WL2B.

In FIG. 8, the wiring WL1A connected with the bump electrode BP1A and the wiring WL1B connected with the bump electrodes BP1B and BP1C are composed of mesh wiring. This is because the wirings WL1A and WL1B constituting the global wiring layer GL are composed of wiring with the smallest sheet resistance value in the wiring structure formed on the first surface side (front surface side) of the semiconductor substrate SUB and the wiring structure with low resistance can be established when the wirings WL1A and WL1B with a small sheet resistance value are composed of mesh wiring. The wiring included in the global wiring layer GL has the smallest sheet resistance value in the wiring structure formed on the first surface side (front surface side) of the semiconductor substrate SUB. Meanwhile, the sheet resistance value becomes larger as the wiring becomes finer in the semi-global wiring layer SGL below the global wiring layer GL and the local wiring layer LL below the semi-global wiring layer SGL. Therefore, for example, in order to reduce resistance of power supply wiring for supplying a power supply potential from the bump electrode BP1A as a starting point in FIG. 8, it is important to establish a wiring network with low resistance in the X and Y directions by using the mesh wiring for the uppermost global wiring layer GL. Also, although the semi-global wiring layer SGL and the local wiring layer LL are interposed in the wiring path to the standard cell SC2, the wirings included in the semi-global wiring layer SGL and the local wiring layer LL have sheet resistance values greater than that of the wiring included in the global wiring layer GL, and thus are not suitable for establishing the mesh wiring with low resistance. Therefore, for the wiring paths in the semi-global wiring layer SGL and the local wiring layer LL, the vias VA1A and VA2A are mainly used instead of the mesh wiring.

On the second surface side (backside) opposite to the first surface of the semiconductor substrate SUB, a bypass wiring RDL is formed, and the bypass wiring RDL is connected with both the through vias TSV1 and TSV2. Also, the through via TSV1 is electrically connected with the bump electrode BP1A via the vias VA2A and VA1A and the wiring WL1A, while the through via TSV2 is electrically connected with the standard cell SC2 via a via VA2C and wiring WL3. Consequently, a potential supplied to the bump electrode BP1A is supplied to the through via TSV1 via the wiring WL1A and the vias VA1A and VA2A and then supplied to the standard cell SC2 via the bypass wiring RDL, the through via TSV2, the via VA2C, and the wiring WL3. For example, the potential supplied from the bump electrode BP1A can be a power supply potential for operating the standard cell SC2. In this case, a sheet resistance value of the bypass wiring RDL is desirably smaller than that of the wiring included in the wiring structure formed on the first surface side (front side) of the semiconductor substrate SUB. This is because since a voltage drop in the bypass wiring RDL of the power supply potential supplied from the bump electrode BP1A to the standard cell SC2 can be reduced, a power supply potential necessary for operation can be supplied from the bump electrode BP1A to the standard cell SC2 even when a bypass path traveling through the bypass wiring RDL is adopted.

In FIG. 8, the wiring structure formed on the first surface side (front surface side) of the semiconductor substrate SUB includes a first wiring structure formed in a first region and a second wiring structure formed in a second region. Specifically, the first wiring structure formed in the first region includes the wiring WL1A connected with the bump electrode BP1A, the via VA1A connected with the wiring WL1A, and the via VA2A connected with the via VA1A. In this case, the first wiring structure is connected with the through via TSV1.

On the other hand, the second wiring structure formed in the second region includes the via VA2C connected with the through via TSV2 and the wiring WL3 included in the semi-global wiring layer SGL. In this case, the second wiring structure is connected with the through via TSV2. Therefore, it can be said that the bypass wiring RDL electrically connects the first wiring structure with the second wiring structure.

Figure 9:
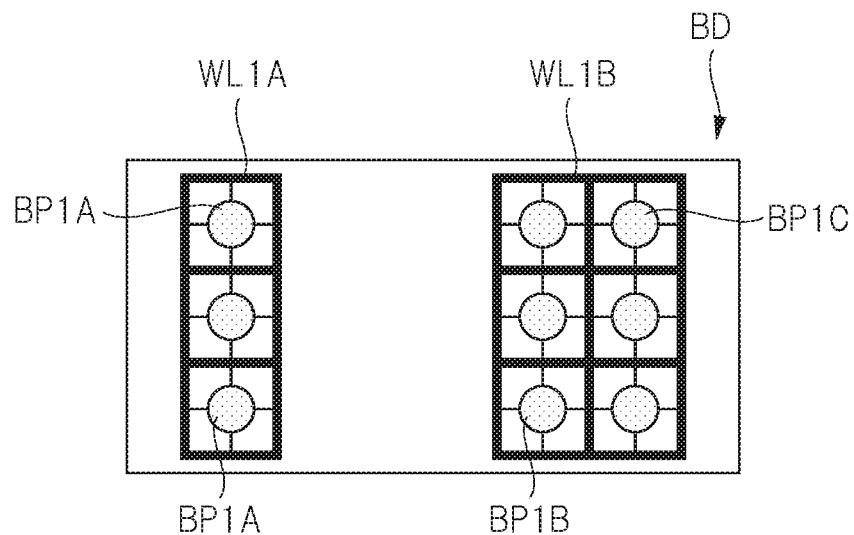
FIG. 9 is a plan view of the base chip according to the first embodiment seen from the top.

FIG. 9 is a plan view of the base chip BD according to the first embodiment seen from the top. As shown in FIG. 9, on the top surface of the base chip BD, a plurality of bump electrodes BP1A, a plurality of bump electrodes BP1B, and a plurality of bump electrodes BP1Cs are mounted, and the wiring WL1A constituting the mesh wiring is formed to connect the plurality of bump electrodes BP1A with each other. Similarly, the wiring WL1B constituting the mesh wiring is formed to connect the plurality of bump electrodes BP1B and the plurality of bump electrodes BP1Cs with each other.

Figure 10:
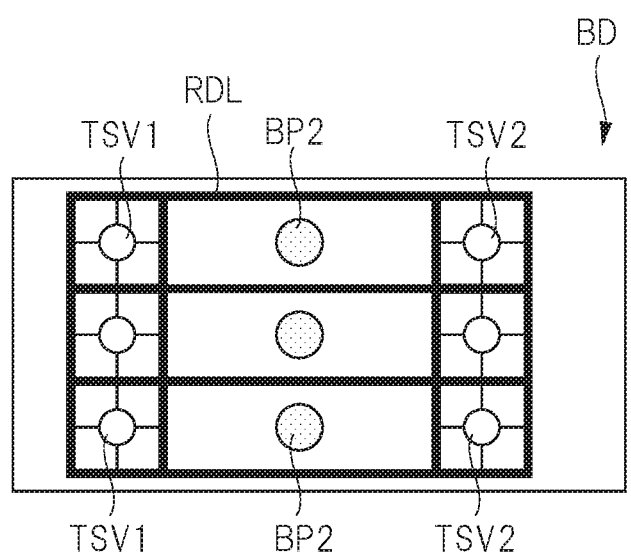
FIG. 10 is a plan view of the base chip according to the first embodiment seen from the bottom.

FIG. 10 is a plan view of the base chip BD according to the first embodiment seen from the bottom. As shown in FIG. 10, the through vias TSV1 and TSV2 are exposed on the bottom surface of the base chip BD, and are electrically connected with each other by the bypass wiring RDL constituting the mesh wiring. Also, on the bottom surface of the base chip BD, a plurality of bump electrodes BP2 electrically connected with signal wiring are mounted.

Figure 11:
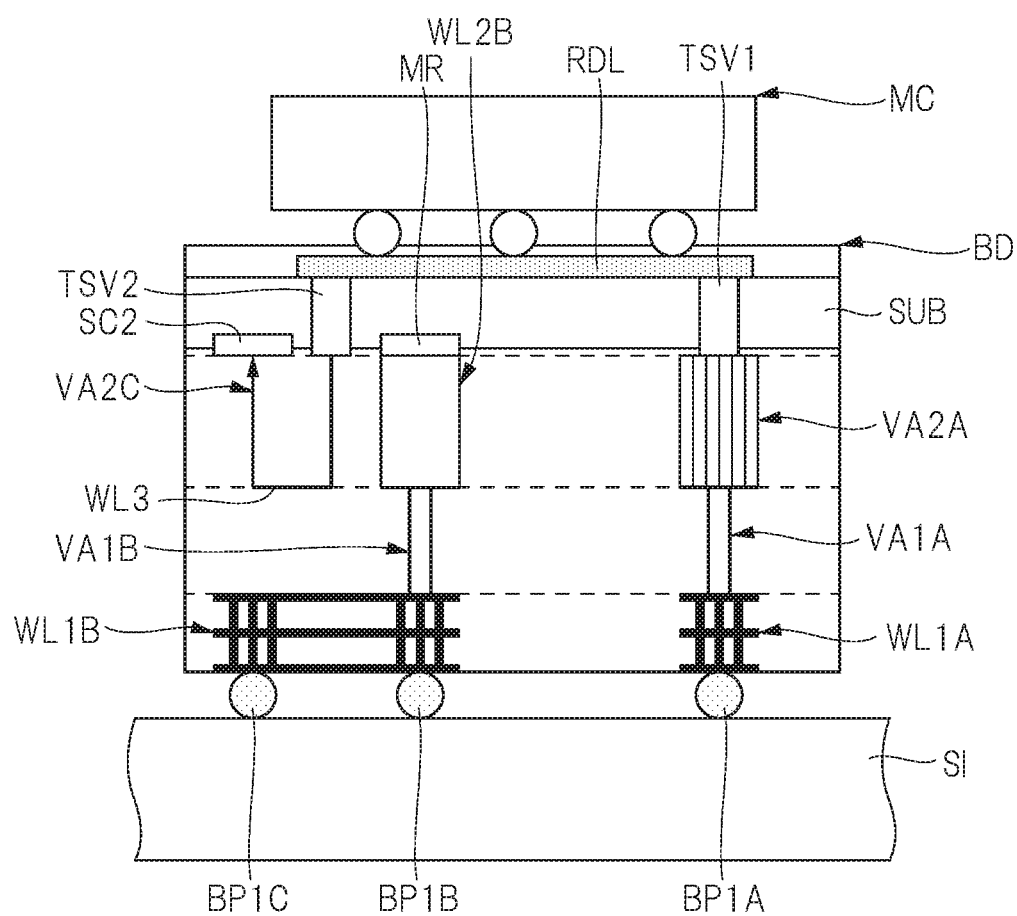
FIG. 11 is a diagram showing a configuration example in which the base chip according to the first embodiment is arranged on an interposer.

Next, FIG. 11 is a diagram showing a configuration example in which the base chip BD according to the first embodiment is arranged on the interposer SI. In FIG. 11, the base chip BD is mounted on the interposer SI. Specifically, the base chip BD is mounted on the interposer SI via the bump electrodes BP1A to BP1C formed on the base chip BD. Also, as shown in FIG. 11, the memory chip MC is mounted on the base chip BD. In this case, the bypass wiring RDL that electrically connects the through via TSV1 with the through via TSV2 is formed in the base chip BD, and the bypass wiring RDL is electrically connected with bump electrodes of the memory chip MC.

Characteristic of the First Embodiment

Next, the characteristic of the first embodiment will be described. The characteristic of the first embodiment is that the bypass wiring RDL connected with the through vias TSV1 and TSV2 is provided on the second surface side (backside) of the semiconductor substrate SUB on the assumption that the through vias TSV1 and TSV2 passing through the semiconductor substrate SUB are formed as shown in, for example, FIG. 8. Accordingly, even when the layout arrangement in which the standard cell SC2 is arranged in the position not planarly overlapping the bump electrode BP1A as shown in FIG. 8 is adopted in order to improve the circuit characteristics represented by electric power, timing, etc., it is possible to suppress the wiring resource shortage in the wiring structure formed on the first surface side of the semiconductor substrate SUB.

According to the characteristic of the first embodiment, when the layout in which the standard cell SC2 is arranged in the position not planarly overlapping the bump electrode BP1A is adopted, the bypass wiring RDL connected with the through vias TSV1 and TSV2 can be used for electrically connecting the bump electrode BP1A with the standard cell SC2. In other words, if the characteristic of the first embodiment is adopted, it becomes unnecessary to electrically connect the bump electrode BP1A with the standard cell SC2 by extending the wiring WL1A constituting the wiring structure (global wiring layer GL) formed on the first surface side of the semiconductor substrate SUB even when the layout in which the standard cell SC2 is arranged in the position not planarly overlapping the bump electrode BP1A is adopted. This means that, according to the characteristic of the first embodiment, it becomes unnecessary to use the wiring resources in the global wiring layer GL dividedly for the extension of the wiring WL1A and the wiring WL1B. Thus, according to the characteristic of the first embodiment, it is possible to suppress the wiring resources in the global wiring layer GL from being used dividedly, and the wiring congestion degree is thus reduced. This suppresses the decrease in wiring width due to the congestion degree of the wiring constituting the global wiring layer GL, so that the increase in the sheet resistance value of the wiring constituting the global wiring layer GL can be suppressed. Consequently, according to the characteristic of the first embodiment, the side effects represented by the increase in the wiring resistance value (sheet resistance value) due to the wiring resource shortage in the wiring structure can be suppressed while maintaining the flexibility of the layout arrangement for improving the circuit characteristics.

Namely, by adopting the characteristic of the first embodiment, the layout in which the standard cell SC2 is arranged in the position not planarly overlapping the bump electrode BP1A can be adopted in order to improve the circuit characteristics represented by, for example, electric power, timing, etc. In other words, according to the characteristic of the first embodiment, even when the layout arrangement capable of improving the circuit characteristics represented by electric power, timing, etc. is adopted, there appears no obvious increase in the wiring resistance value (sheet resistance value) due to the wiring resource shortage in the wiring structure formed on the first surface side of the semiconductor substrate SUB. Therefore, according to the characteristic of the first embodiment, the flexibility of the layout arrangement of the standard cell and the macro can be improved without deteriorating the circuit characteristics. Namely, according to the characteristic of the first embodiment, the improvement of the circuit characteristics and the improvement of the design flexibility of the floor plan can be achieved simultaneously.

In particular, the bypass wiring RDL formed on the second surface side of the semiconductor substrate SUB is formed by, for example, a redistribution layer formation technique. Accordingly, the wiring width of the bypass wiring RDL is greater than that of the wiring constituting the wiring structure formed on the first surface side of the semiconductor substrate SUB by a general wiring formation technique. For example, the wiring width of the bypass wiring RDL is greater than that of the wiring constituting the global wiring layer GL, which has the greatest wiring width in the wiring structure formed by the general wiring formation technique. Therefore, the bypass wiring RDL has a sheet resistance value smaller than that of the wiring constituting the global wiring layer GL. For this reason, the bypass wiring RDL can be used for bypass paths of various wirings such as signal wiring, power supply wiring, and ground wiring, and are particularly desirable when used for bypass paths of the power supply wiring and the ground wiring. This is because when the bypass wiring RDL is used as the power supply wiring, since the bypass wiring RDL has a small sheet resistance value, a power source drop (voltage drop) in the bypass wiring RDL can be reduced, so that a power supply potential necessary for circuit operation can be stably supplied to the standard cell and the macro even when the bypass path through the bypass wiring RDL is adopted. Meanwhile, when the bypass wiring RDL is used as the ground wiring, since the bypass wiring RDL has a small sheet resistance value, the ground potential can be stabilized.

Modification

For example, in the base chip BD according to the first embodiment shown in FIG. 8, the through via TSV2 and the standard cell SC2 are connected by the via VA2C included in the local wiring layer LL and the wiring WL3 included in the semi-global wiring layer SGL.

Figure 12:
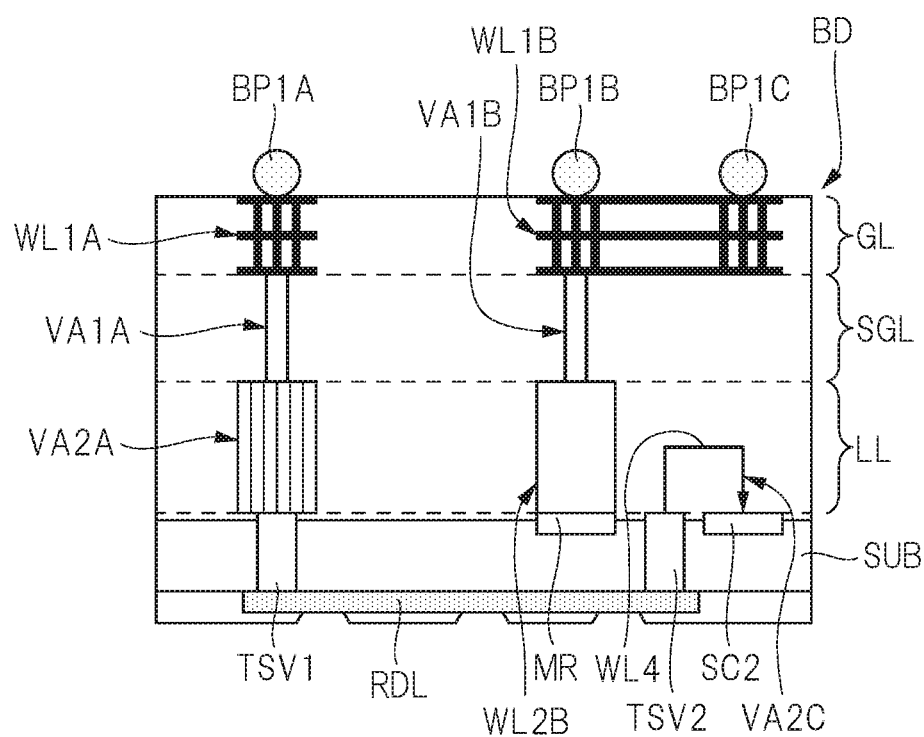
FIG. 12 is a diagram showing a configuration example of a base chip according to a modification of the first embodiment.

On the other hand, FIG. 12 is a diagram showing a configuration example of a base chip BD of a modification of the first embodiment. As shown in FIG. 12, in the base chip BD of the modification, the through via TSV2 and the standard cell SC2 are connected by the via VA2C and the wiring WL4 included in the local wiring layer LL.

Thus, according to the base chip BD of the modification, the length of the connection path between the through via TSV2 and the standard cell SC2 can be made shorter than that of the base chip BD according to the first embodiment. Therefore, according to the base chip BD of the modification, a resistance value of the connection path between the bump electrode BP1A and the standard cell SC2 can be decreased.

In addition, since the wiring WL3 included in the semi-global wiring layer SGL (see FIG. 8) is no longer used, wiring resources in the semi-global wiring layer SGL increase in comparison with the first embodiment. Consequently, according to the base chip BD of the modification, the flexibility of the wiring layout in the semi-global wiring layer SGL can be improved.

Figure 13:
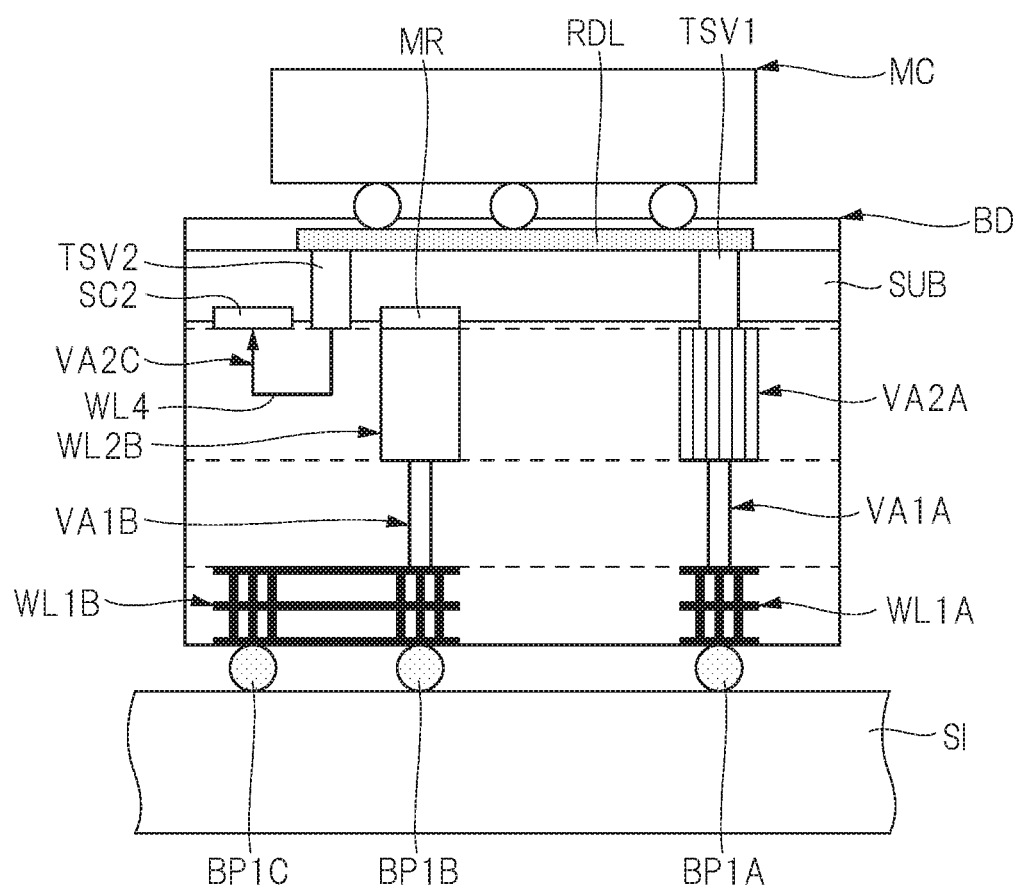
FIG. 13 is a diagram showing a configuration example in which the base chip according to the modification is arranged on an interposer.

FIG. 13 is a diagram showing a configuration example in which the base chip BD of the modification is arranged on the interposer SI. In FIG. 13, the base chip BD is mounted on the interposer SI. Specifically, the base chip BD is mounted on the interposer SI via the bump electrodes BP1A to BP1C formed on the base chip BD. Also, as shown in FIG. 13, the memory chip MC is mounted on the base chip BD. In this case, the bypass wiring RDL electrically connecting the through via TSV1 with the through via TSV2 is formed in the base chip BD, and the bypass wiring RDL is electrically connected with bump electrodes of the memory chip MC.

Application Example 1 (Floor Plan Example 1)

As described above, according to the technical idea (characteristic) of the first embodiment, the improvement of the circuit characteristics and the improvement of the design flexibility of the floor plan can be achieved simultaneously by suppressing divided use of wiring resources. In the following, a floor plan example to which the technical idea of the first embodiment is applied will be described.

Figure 14A:
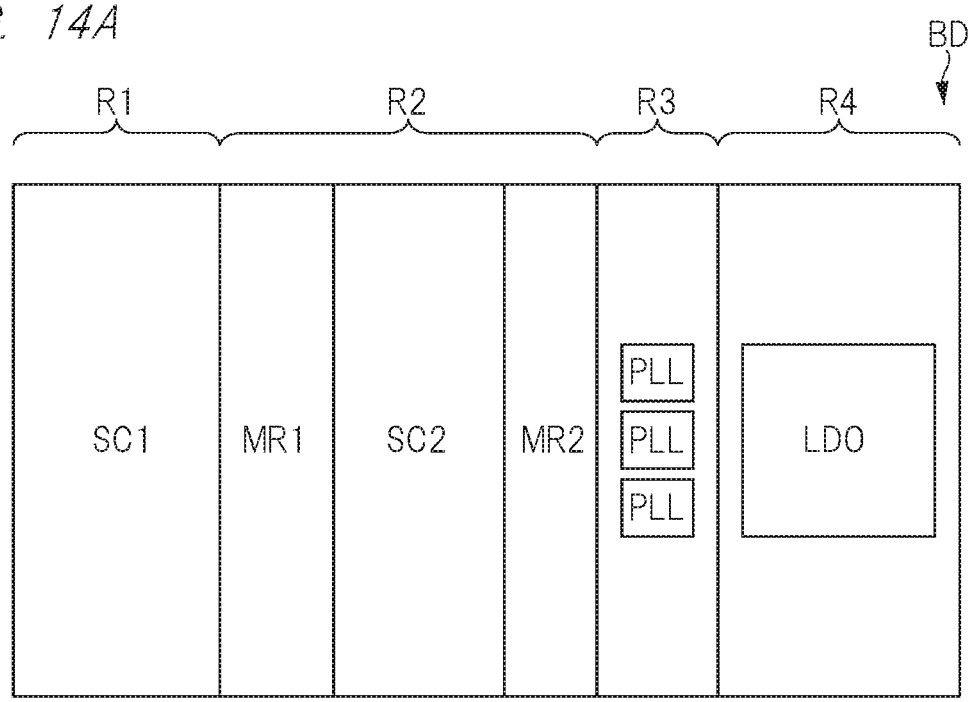
FIG. 14A is a plan view schematically showing a floor plan example 1 according to the first embodiment.
Figure 14B:
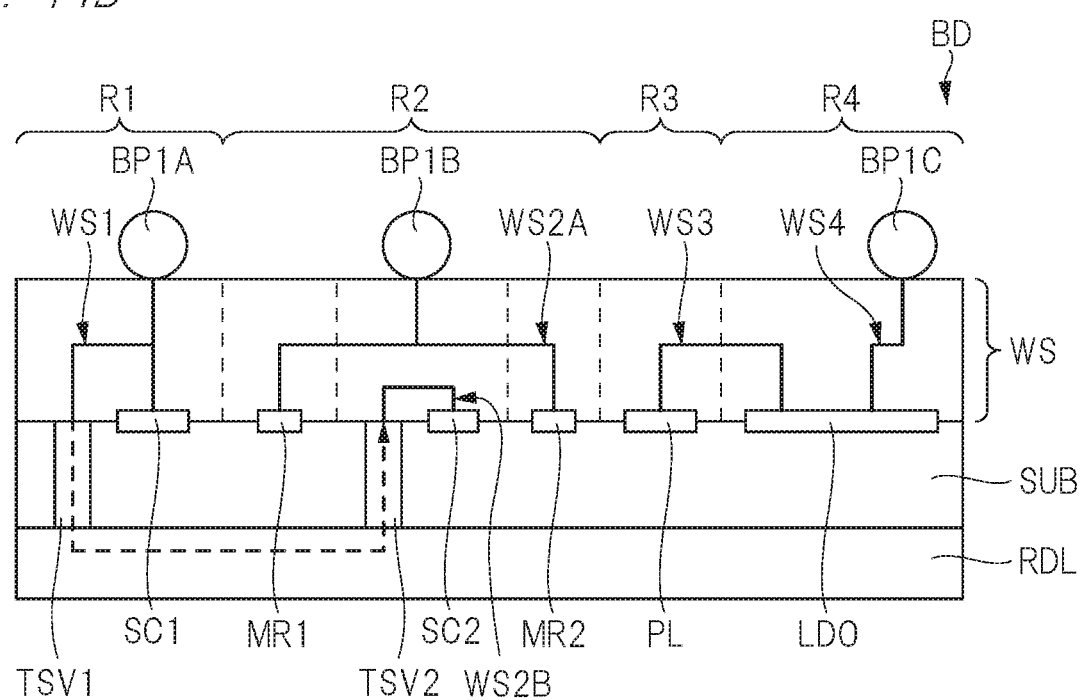
FIG. 14B is a cross-sectional view schematically showing the floor plan example 1 according to the first embodiment.

FIG. 14 is a diagram showing a floor plan example 1 according to the first embodiment. Specifically, FIG. 14A is a plan view schematically showing the floor plan example 1 according to the first embodiment, and FIG. 14B is a cross-sectional view schematically showing the floor plan example 1 according to the first embodiment.

First, as shown in FIG. 14A, the base chip BD includes a region R1 in which a plurality of standard cells SC1 are formed, a region R2 which is formed next to the region R1 and in which a plurality of macros MR1, a plurality of standard cells SC2, and a plurality of macros MR2 are formed, a region R3 which is formed next to the region R2 and in which a plurality of PLL circuits are formed, and a region R4 which is formed next to the region R3 and in which a voltage conversion circuit LDO is formed.

In this case, as shown in FIG. 14B, in the region R1, the bump electrode BP1A and the standard cell SC1 are electrically connected with each other by a wiring structure WS1 constituting a portion of a wiring structure WS, and the bump electrode BP1A and the through via TSV1 are electrically connected with each other by the wiring structure WS1. Next, in the region R2, the bump electrode BP1B is electrically connected with the macro MR1 and is electrically connected with the macro MR2 by a wiring structure WS2A constituting a portion of the wiring structure WS. In addition, the region R2 is provided with the through via TSV2, and the through via TSV2 provided in the region R2 and the through via TSV1 provided in the region R1 are connected by the bypass wiring RDL formed on the second surface side (backside) of the semiconductor substrate SUB. Furthermore, in the region 2, the through via TSV2 and the standard cell SC2 are electrically connected with each other by a wiring structure WS2B. Accordingly, in the floor plan example 1, a first power supply potential can be supplied using the bypass wiring RDL from the bump electrode BP1A formed in the region R1 to both the standard cell SC1 in the region R1 and the standard cell SC2 in the region R2 that are arranged to sandwich the macro MR1 in a plan view. Meanwhile, a second power supply potential that is different from the first power supply potential is supplied from the bump electrode BP1B formed in the region R2 to both the macro MR1 and the macro MR2 via the wiring structure WS2A.

Next, as shown in FIG. 14B, the PLL circuits PL formed in the region R3 and the voltage conversion circuit LDO formed in the region R4 are electrically connected with each other by a wiring structure WS3 that is formed across the region R3 and the region R4. Also, the bump electrode BP1C and the voltage conversion circuit LDO formed in the region R4 are electrically connected with each other by a wiring structure WS4. Accordingly, a third power supply potential is supplied from the bump electrode BP1C formed in the region R4 to the voltage conversion circuit LDO via the wiring structure WS4. Then, the third power supply potential is converted into a fourth power supply potential in the voltage conversion circuit LDO, and the converted fourth power supply potential is supplied to the PLL circuits PL formed in the region R3 via the wiring structure WS3.

In the floor plan example 1 configured as described above, the first power supply potential for operating the standard cell SC2 can be supplied from the bump electrode PB1A formed in the region R1 to the standard cell SC2 formed in the region R2 via the bypass wiring RDL formed on the second surface side of the semiconductor substrate SUB. That is, in the floor plan example 1, by using the bypass wiring formed on the second surface side (backside) of the semiconductor substrate SUB, the first power supply potential can be supplied to the standard cell SC2 arranged between the macro MR1 and the macro MR2 while suppressing the wiring resource shortage in the wiring structure WS that is formed on the first surface side (front surface side) of the semiconductor substrate.

Application Example 2 (Floor Plan Example 2)

Figure 15A:
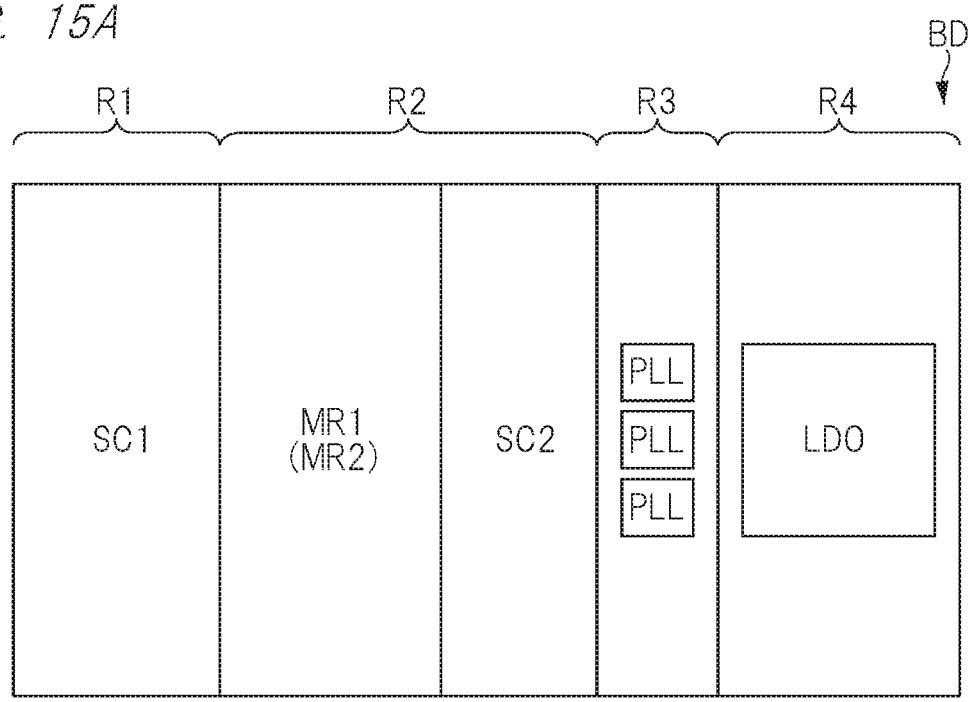
FIG. 15A is a plan view schematically showing a floor plan example 2 according to the first embodiment.
Figure 15B:
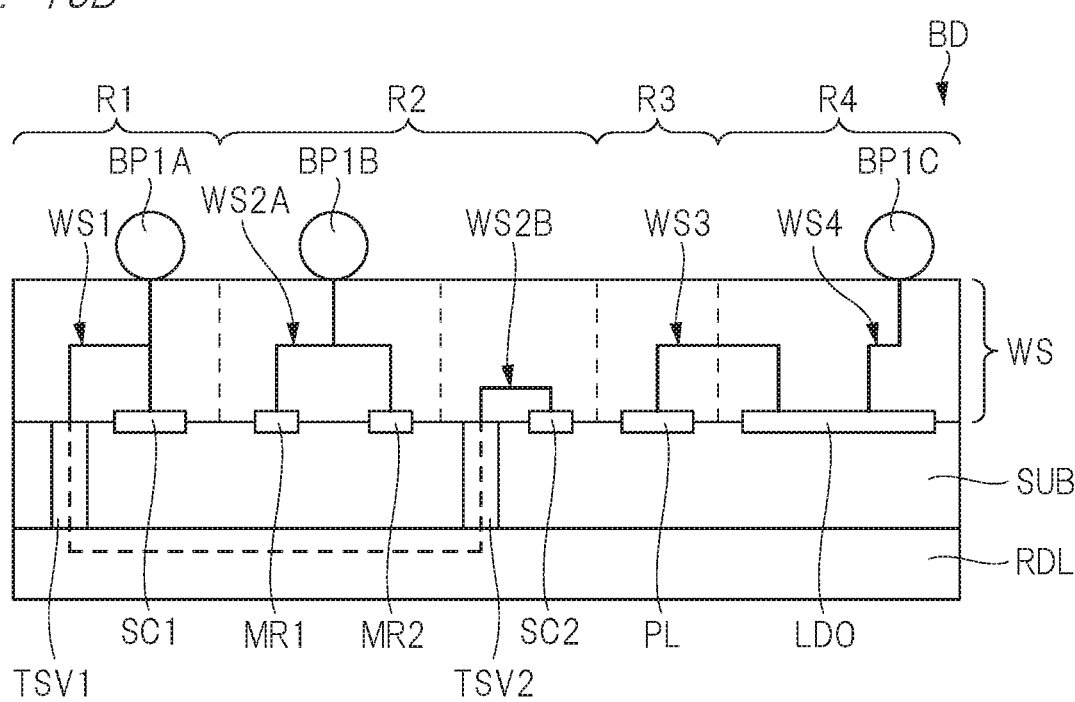
FIG. 15B is a cross-sectional view schematically showing the floor plan example 2 according to the first embodiment.

FIG. 15 is a diagram showing a floor plan example 2 according to the first embodiment. Specifically, FIG. 15A is a plan view schematically showing the floor plan example 2 according to the first embodiment, and FIG. 15B is a cross-sectional view schematically showing the floor plan example 2 according to the first embodiment.

First, as shown in FIG. 15A, the base chip BD includes a region R1 in which a plurality of standard cells SC1 are formed, a region R2 which is formed next to the region R1 and in which a plurality of macros MR1, a plurality of macros MR2, and, a plurality of standard cells SC2 are formed, a region R3 which is formed next to the region R2 and in which a plurality of PLL circuits are formed, and a region R4 which is formed next to the region R3 and in which a voltage conversion circuit LDO is formed.

In this case, as shown in FIG. 15B, in the region R1, the bump electrode BP1A and the standard cell SC1 are electrically connected with each other by a wiring structure WS1 constituting a portion of a wiring structure WS, and the bump electrode BP1A and the through via TSV1 are electrically connected with each other by the wiring structure WS1. Next, in the region R2, the bump electrode BP1B is electrically connected with the macro MR1 and is electrically connected with the macro MR2 by a wiring structure WS2A constituting a portion of the wiring structure WS. Also, the region R2 is provided with the through via TSV2, and the through via TSV2 provided in the region R2 and the through via TSV1 provided in the region R1 are connected with each other by the bypass wiring RDL formed on the second surface side (backside) of the semiconductor substrate SUB. Furthermore, in the region 2, the through via TSV2 and the standard cell SC2 are electrically connected with each other by a wiring structure WS2B. Accordingly, in the floor plan example 2, a first power supply potential can be supplied using the bypass wiring RDL from the bump electrode BP1A formed in the region R1 to both the standard cell SC1 in the region R1 and the standard cell SC2 in the region R2 that are arranged to sandwich the macro MR1 and the macro MR2 in a plan view. Meanwhile, a second power supply potential that is different from the first power supply potential is supplied from the bump electrode BP1B formed in the region R2 to both the macro MR1 and the macro MR2 via the wiring structure WS2A.

Next, as shown in FIG. 15B, the PLL circuits PL formed in the region R3 and the voltage conversion circuit LDO formed in the region R4 are electrically connected with each other by a wiring structure WS3 that is formed across the region R3 and the region R4. Also, the bump electrode BP1C and the voltage conversion circuit LDO formed in the region R4 are electrically connected with each other by a wiring structure WS4. Accordingly, a third power supply potential is supplied from the bump electrode BP1C formed in the region R4 to the voltage conversion circuit LDO via the wiring structure WS4. Then, the third power supply potential is converted into a fourth power supply potential in the voltage conversion circuit LDO, and the converted fourth power supply potential is supplied to the PLL circuits PL formed in the region R3 via the wiring structure WS3.

Also in the floor plan example 2 configured as described above, the first power supply potential for operating the standard cell SC2 can be supplied from the bump electrode BP1A formed in the region R1 to the standard cell SC2 formed in the region R2 via the bypass wiring RDL formed on the second surface side of the semiconductor substrate SUB. That is, also in the floor plan example 2, by using the bypass wiring formed on the second surface side (backside) of the semiconductor substrate SUB, the first power supply potential can be supplied to the standard cell SC1 and the standard cell SC2 arranged between the macro MR1 and the macro MR2 while suppressing the wiring resource shortage in the wiring structure WS that is formed on the first surface side (front surface side) of the semiconductor substrate.

Application Example 3 (Floor Plan Example 3)

Figure 16A:
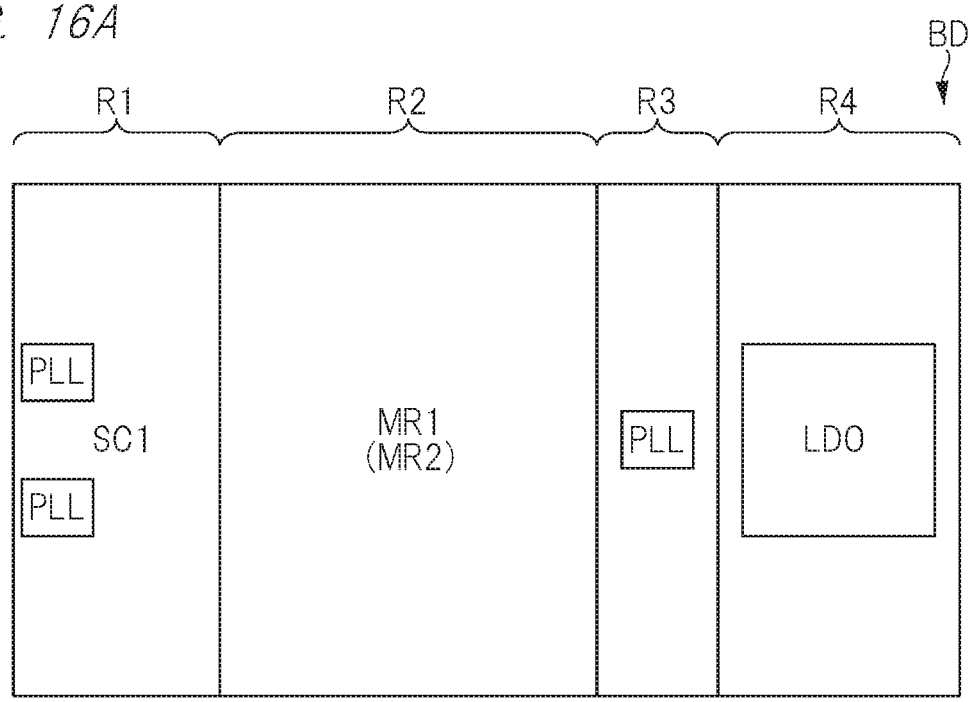
FIG. 16A is a plan view schematically showing a floor plan example 3 according to the first embodiment.
Figure 16B:
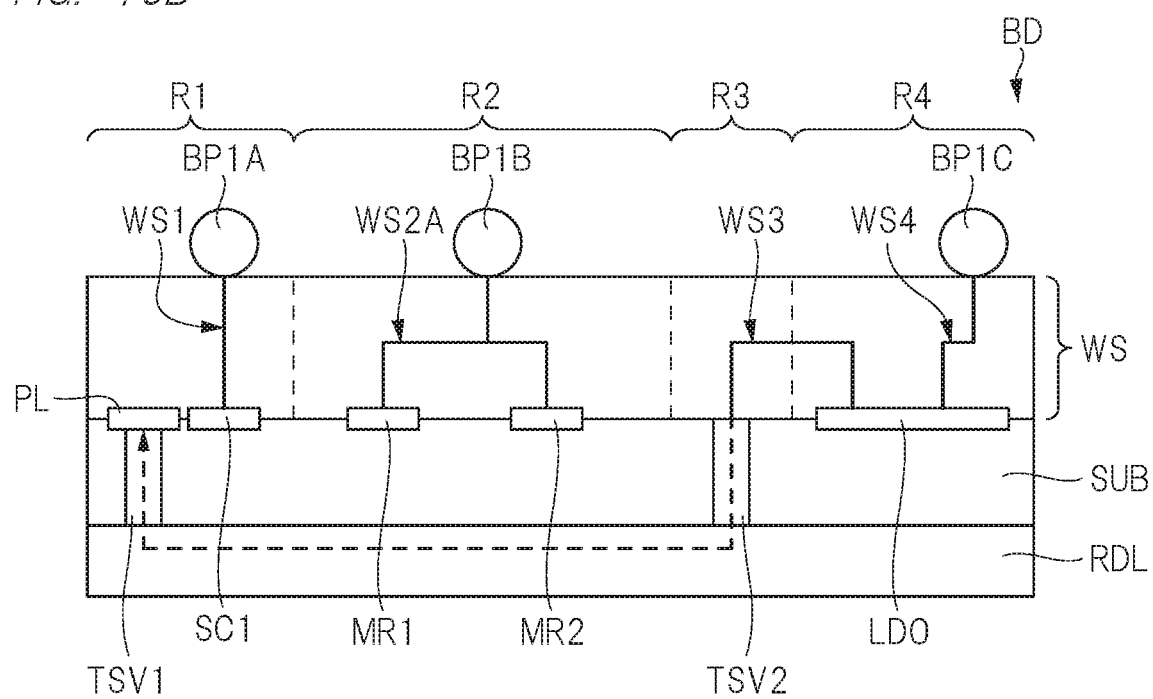
FIG. 16B is a cross-sectional view schematically showing the floor plan example 3 according to the first embodiment.

FIG. 16 is a diagram showing a floor plan example 3 according to the first embodiment. Specifically, FIG. 16A is a plan view schematically showing the floor plan example 3 according to the first embodiment, and FIG. 16B is a cross-sectional view schematically showing the floor plan example 3 according to the first embodiment.

First, as shown in FIG. 16A, the base chip BD includes a region R1 in which a plurality of standard cells SC1 and a plurality of PLL circuits PL are formed, a region R2 which is formed next to the region R1 and in which a plurality of macros MR1 and a plurality of macros MR2 are formed, a region R3 which is formed next to the region R2 and in which a PLL circuit is formed, and a region R4 which is formed next to the region R3 and in which a voltage conversion circuit LDO is formed.

In this case, as shown in FIG. 16B, in the region R1, the bump electrode BP1A and the standard cell SC1 are electrically connected with each other by a wiring structure WS1 constituting a portion of a wiring structure WS. Accordingly, a first power supply potential is supplied from the bump electrode BP1A formed in the region R1 to the standard cell SC1 via the wiring structure WS1. Furthermore, the through via TSV1 is formed in the region R1, and the through via TSV1 is electrically connected with the PLL circuits PL formed in the region R1.

Next, in the region R2, the bump electrode BP1B is electrically connected with the macro MR1 and the macro MR2 by a wiring structure WS2A constituting a portion of the wiring structure WS. Accordingly, a second power supply potential that is different from the first power supply potential is supplied from the bump electrode BP1B formed in the region R2 to both the macro MR1 and the macro MR2 via the wiring structure WS2A.

Also, as shown in FIG. 16B, the through via TSV2 is formed in the region R3. Also, the through via TSV2 formed in the region R3 and the through via TSV1 formed in the region R1 are electrically connected with each other by the bypass wiring RDL formed on the second surface side (backside) of the semiconductor substrate SUB. Also, the through via TSV2 formed in the region R3 and the voltage conversion circuit LDO formed in the region R4 are electrically connected with each other by a wiring structure WS3 formed across the region R3 and the region R4. Furthermore, the bump electrode BP1C and the voltage conversion circuit LDO formed in the region R4 are electrically connected with each other by a wiring structure WS4. Accordingly, a third power supply potential is supplied from the bump electrode BP1C formed in the region R4 to the voltage conversion circuit LDO via the wiring structure WS4. Then, the third power supply potential is converted into a fourth power supply potential in the voltage conversion circuit LDO, and the converted fourth power supply potential is supplied to the PLL circuits PL formed in the region R1 via the wiring structure WS3, the through via TSV2, the bypass wiring RDL, and the through via TSV1. The floor plan example 3 has the advantage of being able to arrange the PLL circuit PL, which generates clock signals used in the standard cell SC1, near the standard cell SC1.

In the floor plan example 3 configured as described above, the fourth power supply potential that has been converted in the voltage conversion circuit LDO formed in the region R4 is supplied to the PLL circuits PL formed in the region R1 via the bypass wiring RDL formed on the second surface side of the semiconductor substrate SUB. That is, in the floor plan example 3, by using the bypass wiring formed on the second surface side (backside) of the semiconductor substrate SUB, the fourth power supply potential can be supplied to the PLL circuits PL arranged in the region R1 from the voltage conversion circuit LDO arranged in the region R4 while suppressing the wiring resource shortage in the wiring structure WS that is formed on the first surface side (front surface side) of the semiconductor substrate. Then, clock signals are generated in the PLL circuits PL, and the clock signals generated in the PLL circuits PL are used in the standard cell SC1 arranged in the region R1.

Second Embodiment

The technical idea of the first embodiment is that the bypass wiring RDL connected with the through vias TSV1 and TSV2 is provided on the second surface side (backside) of the semiconductor substrate SUB on the assumption that the through vias TSV1 and TSV2 passing through the semiconductor substrate SUB are formed as shown in, for example, FIG. 8. Also, the semiconductor substrate SUB is provided with the through vias TSV1 and TSV2 passing therethrough, and the wiring structure is formed on the first surface side of the semiconductor substrate SUB.

In order to use the bypass wiring RDL for the connection path between the bump electrode and the circuit device, the wiring structure formed on the first surface side of the semiconductor substrate SUB needs to be connected to the through via TSV1 formed to pass through the semiconductor substrate SUB. Namely, the wiring structure formed on the first surface side of the semiconductor substrate SUB and the through via TSV1 (TSV2) passing through the semiconductor substrate SUB are interposed in the connection path between the bump electrode formed on the first surface side of the semiconductor substrate SUB and the bypass wiring RDL formed on the second surface side of the semiconductor substrate SUB. Accordingly, in order to electrically connect the bump electrode and the bypass wiring RDL, it is inevitable that the interposed wiring structure and through via TSV1 (TSV2) are electrically connected with each other.

In this regard, the inventor found that room for improvement in the increase in the wiring resistance becomes apparent unless some contrivance is provided when the wiring structure is electrically connected to the through via TSV1 (TSV2) and have provided a contrivance to this room for improvement to be apparent. Hereinafter, a related art with the room for improvement that the wiring resistance increases unless some contrivance is provided when the wiring structure is electrically connected to the through via TSV1 (TSV2) will be first described, and then a technical idea of a second embodiment provided with the contrivance to the room for improvement in the related art will be described.

Description of a Related Art

Figure 17:
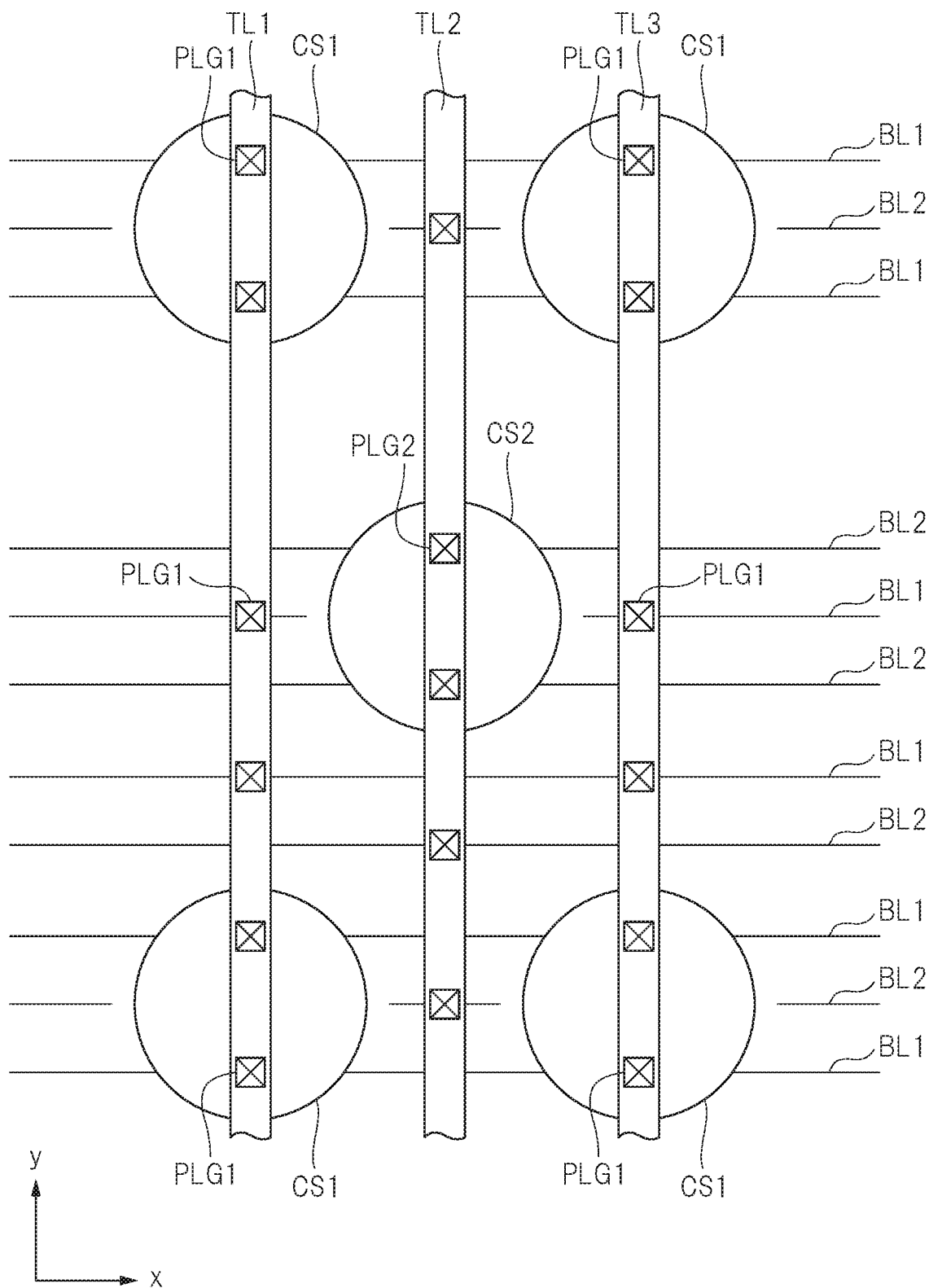
FIG. 17 is a plan view showing an arrangement relation between longitudinal trunk lines formed in a second wiring layer (M2 wiring layer) included in a wiring structure formed on a first surface side of a semiconductor substrate and horizontal branch lines formed in a first wiring layer (M1 wiring layer) positioned in a lower layer of the second wiring layer.
Figure 18:
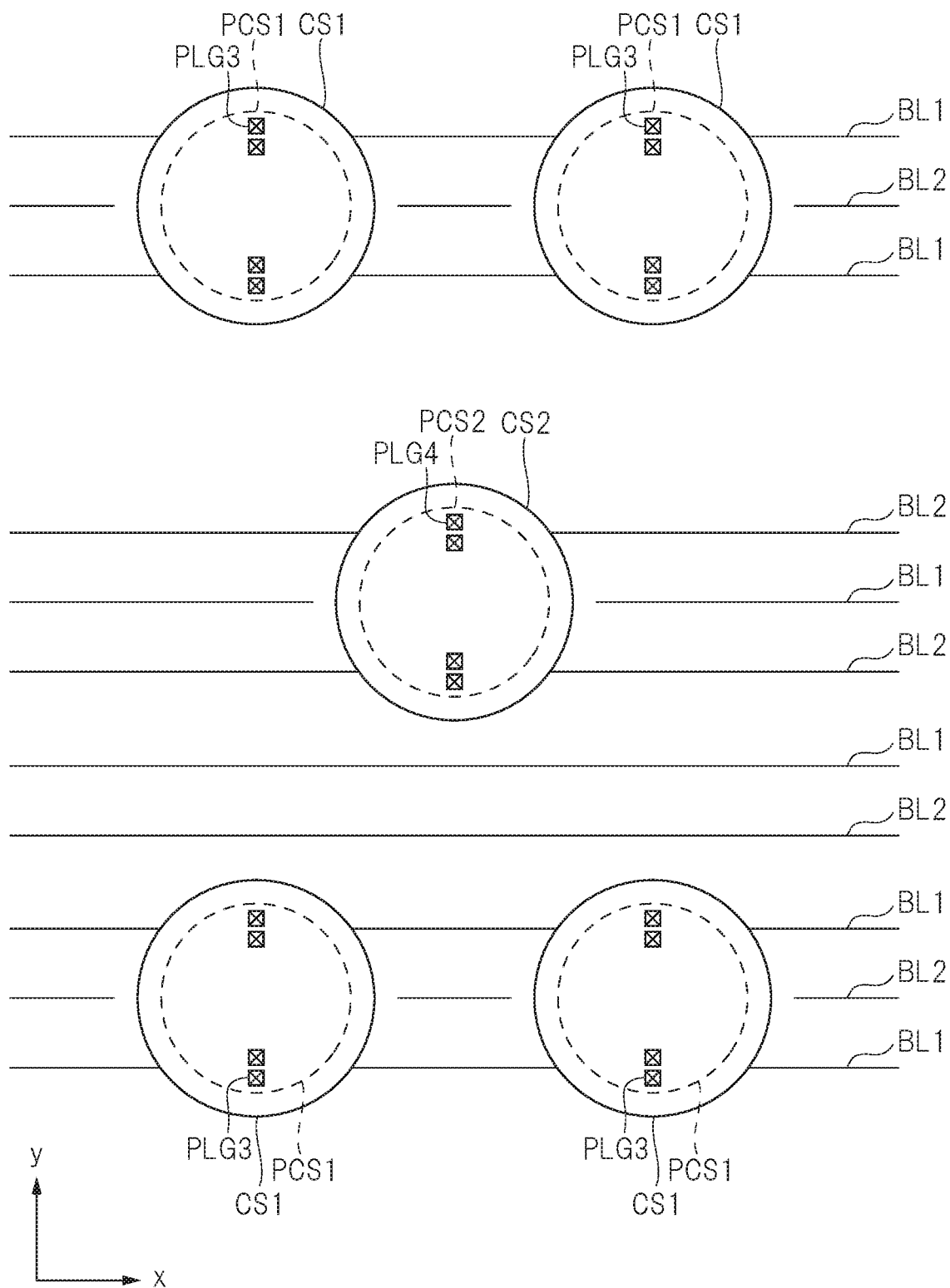
FIG. 18 is a plan view showing an arrangement relation between the horizontal branch lines formed in the first wiring layer and polysilicon connection sections formed in a lower layer of the first wiring layer.
Figure 19:
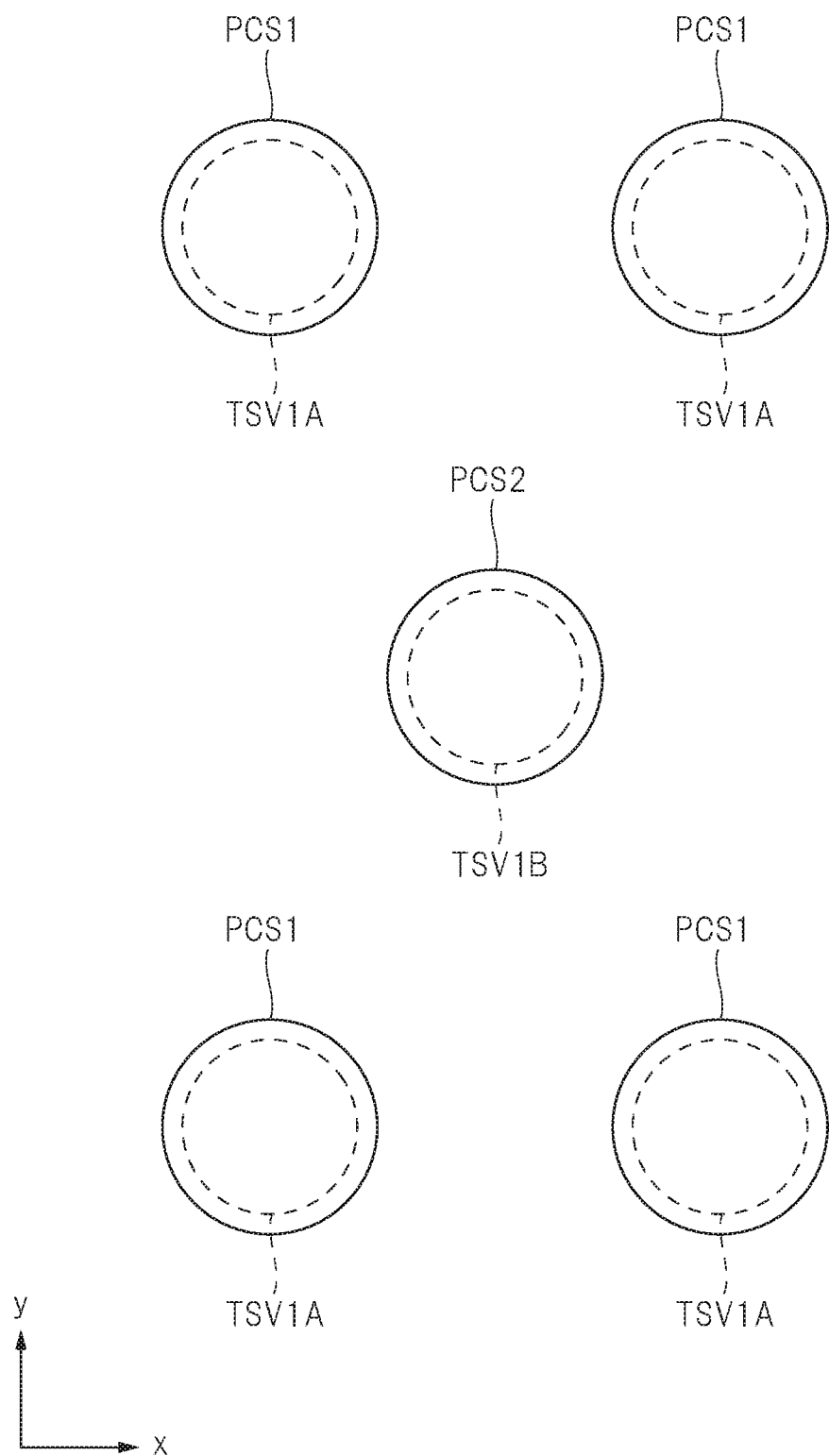
FIG. 19 is a plan view showing an arrangement relation between the polysilicon connection sections and through vias positioned in a lower layer of the polysilicon connection sections and formed to pass through the semiconductor substrate.

FIGS. 17 to 19 are diagrams illustrating a related art. Specifically, FIG. 17 is a plan view showing an arrangement relation between longitudinal trunk lines formed in a second wiring layer (M2 wiring layer) included in the wiring structure formed on the first surface side of the semiconductor substrate and horizontal branch lines formed in a first wiring layer (M1 wiring layer) positioned in a lower layer of the second wiring layer. FIG. 18 is a plan view showing an arrangement relation between the horizontal branch lines formed in the first wiring layer and polysilicon connection sections formed in a lower layer of the first wiring layer. FIG. 19 is a plan view showing an arrangement relation between the polysilicon connection sections and through vias formed to pass through the semiconductor substrate positioned in a lower layer of the polysilicon connection sections.

First, in FIG. 17, each of the longitudinal trunk lines TL1 to TL3 is arranged to extend in the y direction, and the longitudinal trunk lines TL1 to TL3 are aligned in the x direction. The longitudinal trunk lines TL1 to TL3 constitute a portion of the wiring structure formed on the first surface side of the semiconductor substrate. Also, the longitudinal trunk lines TL1 to TL3 are electrically connected with power supply mesh wiring (not shown) included in the wiring structure and positioned in an upper layer of the longitudinal trunk lines TL1 to TL3. The power supply mesh wiring is electrically connected with bump electrodes (not shown) mounted on the wiring structure. A power supply potential is supplied to the longitudinal trunk lines TL1 and TL3 configured in such a manner, while a ground potential is supplied to the longitudinal trunk line TL2.

Next, as shown in FIG. 17, the horizontal branch lines BL1 and BL2 are formed in the first wiring layer (M1 wiring layer) positioned in the lower layer of the second wiring layer (M2 wiring layer) in which the longitudinal trunk lines TL1 to TL3 are formed. Each of the horizontal branch lines BL1 and BL2 extends in the x direction intersecting the y direction in which each of the longitudinal trunk lines TL1 to TL3 extends. In the first wiring layer (M1 wiring layer), the horizontal branch lines BL1 and the horizontal branch lines BL2 are arranged so as to alternately align in the y direction. In this case, a power supply potential is supplied to the horizontal branch lines BL1, while a ground potential (reference potential) is supplied to the horizontal branch lines BL2.

In FIG. 17, the horizontal branch lines BL1 to which a power supply potential is supplied are electrically connected with the longitudinal trunk line TL1 to which a power supply potential is supplied and the longitudinal trunk line TL3 to which a power supply potential is supplied. Specifically, the horizontal branch lines BL1 are connected with connection sections CS1 formed in the first wiring layer (M1 wiring layer), and the connection sections CS1 are electrically connected with the longitudinal trunk lines TL1 and TL3 formed in the second wiring layer (M2 wiring layer) via plugs PLG1. In this way, the longitudinal trunk line TL1 and the horizontal branch lines BL1 are electrically connected with each other via the connection sections CS1 and the plugs PLG1. Similarly, the longitudinal trunk line TL3 and the horizontal branch lines BL1 are electrically connected with each other via the connection sections CS1 and the plugs PLG1. In this case, as shown in FIG. 17, the horizontal branch lines BL2 to which a ground potential is supplied need to be electrically isolated from the connection sections CS1 connected with the horizontal branch lines BL1 to which a power supply potential is supplied, and thus the horizontal branch lines BL2 are divided by the connection sections CS1.

On the other hand, in FIG. 17, the horizontal branch lines BL2 to which a ground potential is supplied are electrically connected with the longitudinal trunk line TL2 to which a ground potential is supplied. Specifically, the horizontal branch lines BL2 are connected with a connection section CS2 formed in the first wiring layer (M1 wiring layer), and the connection section CS2 is electrically connected with the longitudinal trunk line TL2 formed in the second wiring layer (M2 wiring layer) via plugs PLG2. In this way, the longitudinal trunk line TL2 and the horizontal branch lines BL2 are electrically connected with each other via the connection section SC2 and the plugs PLG2. In this case, as shown in FIG. 17, the horizontal branch line BL1 to which a power supply potential is supplied needs to be electrically isolated from the connection section CS2 connected with the horizontal branch lines BL2 to which a ground potential is supplied, and thus the horizontal branch line BL1 is divided by the connection section CS2.

Next, as shown in FIG. 18, in the lower layer of the connection sections CS1 formed in the first wiring layer (M1 wiring layer), polysilicon connection sections PCS1 are arranged. For example, the polysilicon connection sections PCS1 are formed to be contained in the connection sections CS1 arranged in the upper layer in a plan view. In this case, the connection sections CS1 are connected with the polysilicon connection sections PCS1 by a plurality of plugs PLG3. Therefore, a power supply potential is supplied to the polysilicon connection sections PCS1. Similarly, as shown in FIG. 18, in the lower layer of the connection section CS2 formed in the first wiring layer (M1 wiring layer), a polysilicon connection section PCS2 is arranged. For example, the polysilicon connection section PCS2 is formed to be contained in the connection section CS2 arranged in the upper layer in a plan view. In this case, the connection section CS2 is connected with the polysilicon connection section PCS2 by a plurality of plugs PLG4. Therefore, a ground potential is supplied to the polysilicon connection section PCS2.

Next, as shown in FIG. 19, in the lower layer of the polysilicon connection sections PCS1, through vias TSV1A passing through the semiconductor substrate are formed. For example, the through vias TSV1A are formed to be contained in the polysilicon connection sections PCS1 arranged in the upper layer in a plan view. The through vias TSV1A configured in such a manner are connected with the polysilicon connection sections PCS1. Accordingly, a power supply potential is supplied to the through vias TSV1A. Similarly, as shown in FIG. 19, in the lower layer of the polysilicon connection section PCS2, a through via TSV1B passing through the semiconductor substrate is formed. For example, the through via TSV1B is formed to be contained in the polysilicon connection section PCS2 arranged in the upper layer in a plan view. The through via TSV1B configured in such a manner is connected with the polysilicon connection section PCS2. Therefore, a ground potential is supplied to the through via TSV1B.

Room for Improvement in the Related Art

In the related art configured in such a manner, for example, as shown in FIGS. 17 and 18, the horizontal branch lines BL2 to which a ground potential is supplied are divided by the connection sections CS1 formed in the first wiring layer (M1 wiring layer). In this case, there appears an obvious increase in lengths of supply paths for supplying a ground potential from the branch lines BL2 to a part of the standard cells. This means an increase in wiring resistance in the supply paths for supplying a ground potential from the branch lines BL2 to a part of the standard cells, which may disrupt some operation of a part of the standard cells. In addition, when standard cells with a tap-less structure are arranged, it is necessary to additionally arrange the tap cell for each region where the horizontal branch lines BL2 are divided. This means a decrease in arrangement efficiency of the standard cells. Similarly, as shown in FIGS. 17 and 18, the horizontal branch line BL1 to which a power supply potential is supplied is divided by the connection section CS2 formed in the first wiring layer (M1 wiring layer). In this case, there appears an obvious increase in length of a supply path for supplying a power supply potential from the branch line BL1 to apart of the standard cells. This means an increase in wiring resistance in the supply path for supplying a power supply potential from the branch line BL1 to a part of the standard cells, which may disrupt some operation of the standard cells. In addition, when standard cells with a tap-less structure are arranged, it is necessary to additionally arrange the tap cell for each region where the horizontal branch line BL1 is divided. This means a decrease in arrangement efficiency of the standard cells.

As described above, it is appreciated that, in the related art, the room for improvement in the increase in wiring resistance and the decrease in arrangement efficiency of the standard cells becomes apparent unless some contrivance is provided when the wiring structure is electrically connected to the through vias. Thus, a technical idea of the second embodiment in which some contrivance has been provided to the room for improvement in the related art will be described below.

Configuration of the Semiconductor Device in the Second Embodiment

Figure 20:
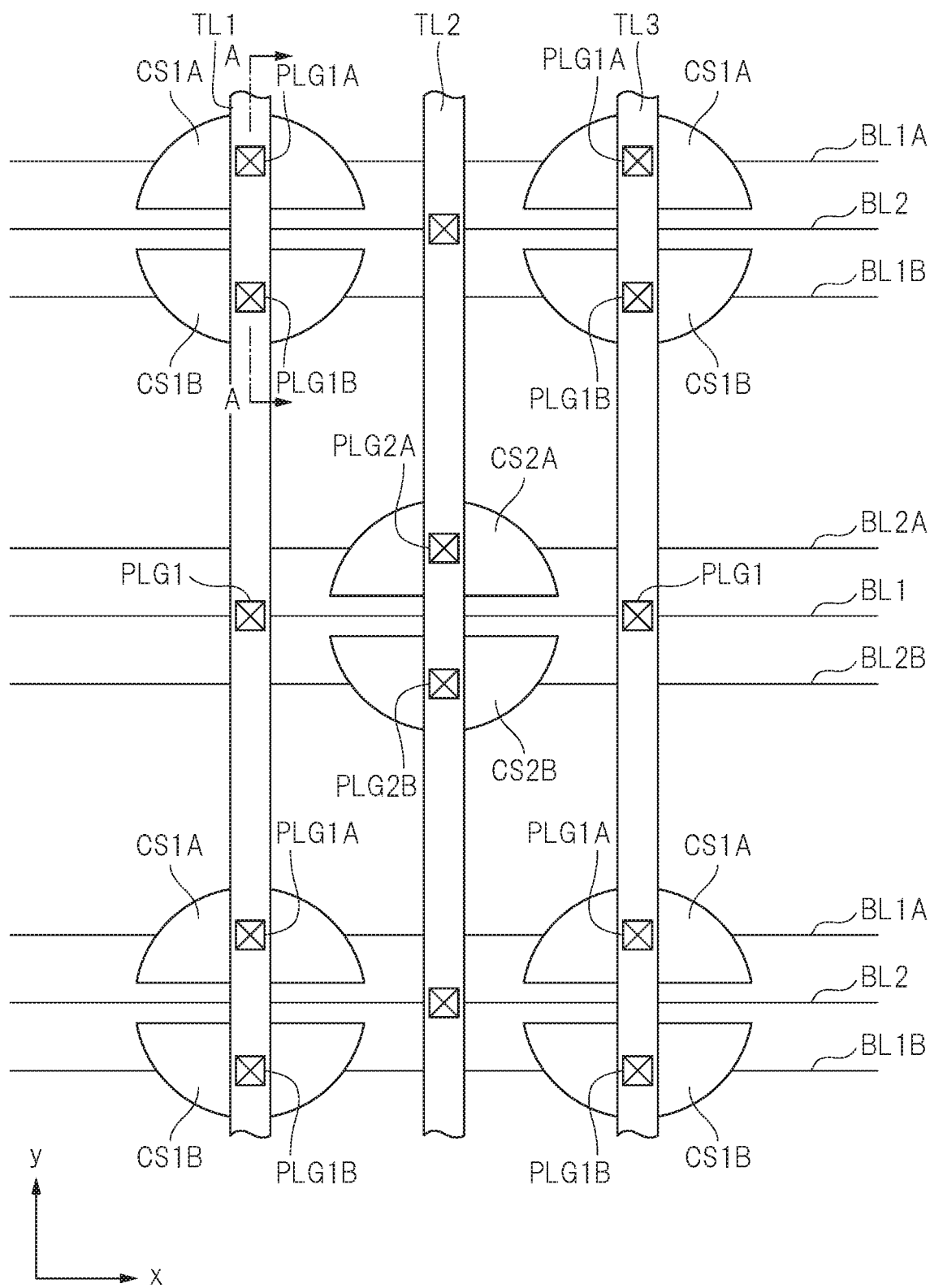
FIG. 20 is a plan view showing an arrangement relation between longitudinal trunk lines formed in a second wiring layer (M2 wiring layer) included in a wiring structure formed on a first surface side of a semiconductor substrate and horizontal branch lines formed in a first wiring layer (M1 wiring layer) positioned in a lower layer of the second wiring layer.
Figure 21:
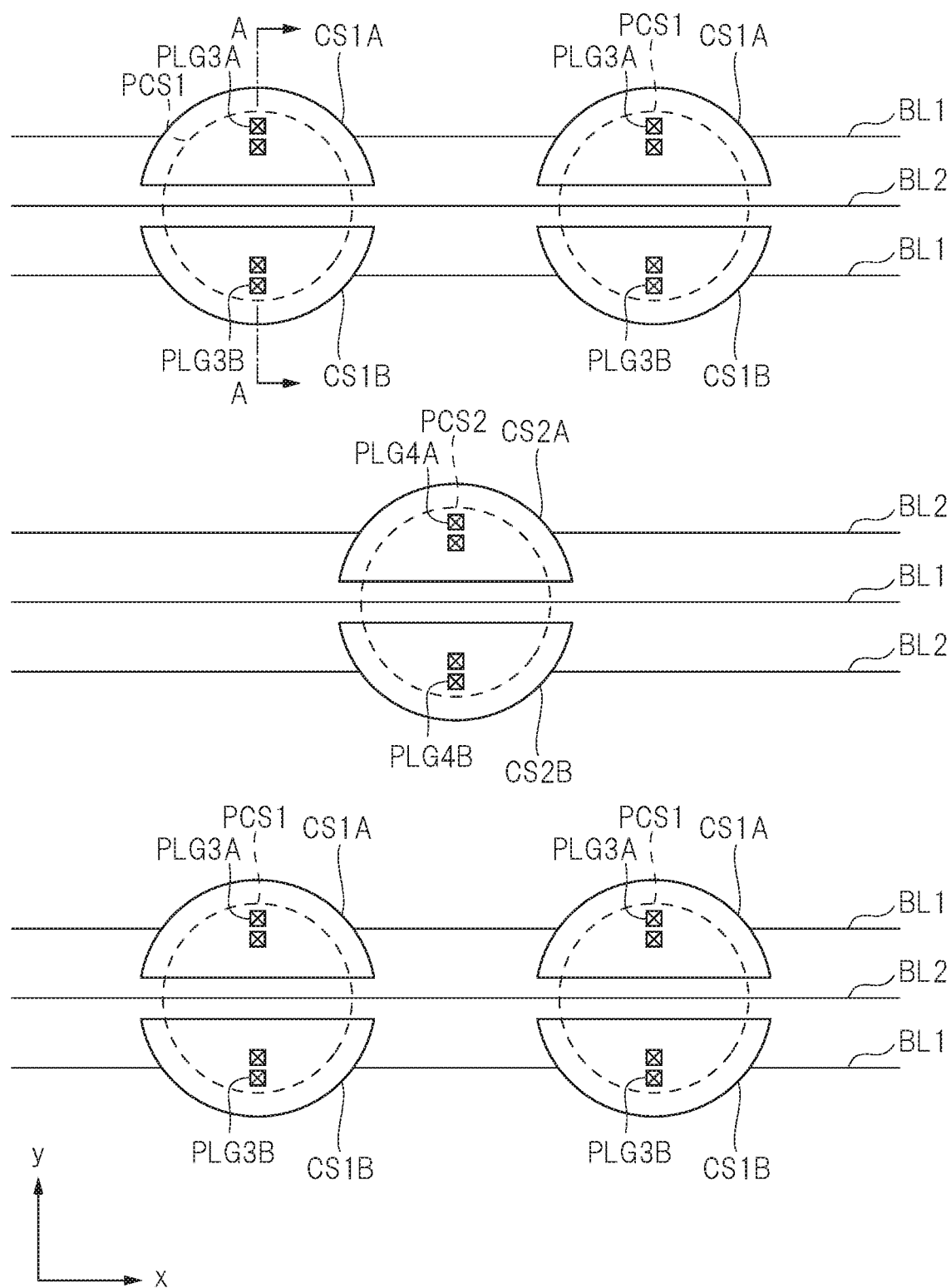
FIG. 21 is a plan view showing an arrangement relation between the horizontal branch lines formed in the first wiring layer and polysilicon connection sections formed in a lower layer of the first wiring layer.
Figure 22:
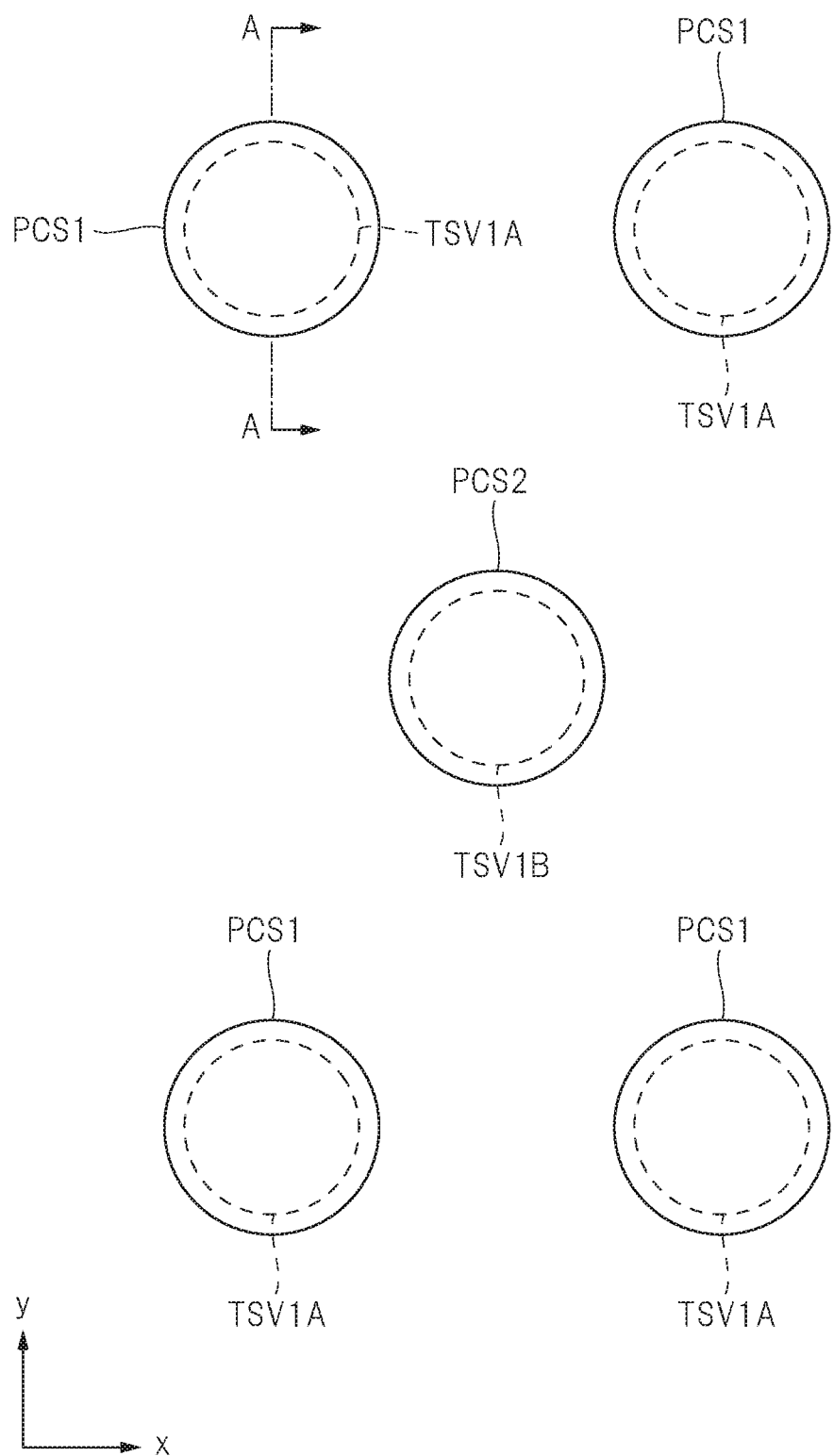
FIG. 22 is a plan view showing an arrangement relation between the polysilicon connection sections and through vias positioned in a lower layer of the polysilicon connection sections and formed to pass through the semiconductor substrate.
Figure 23:
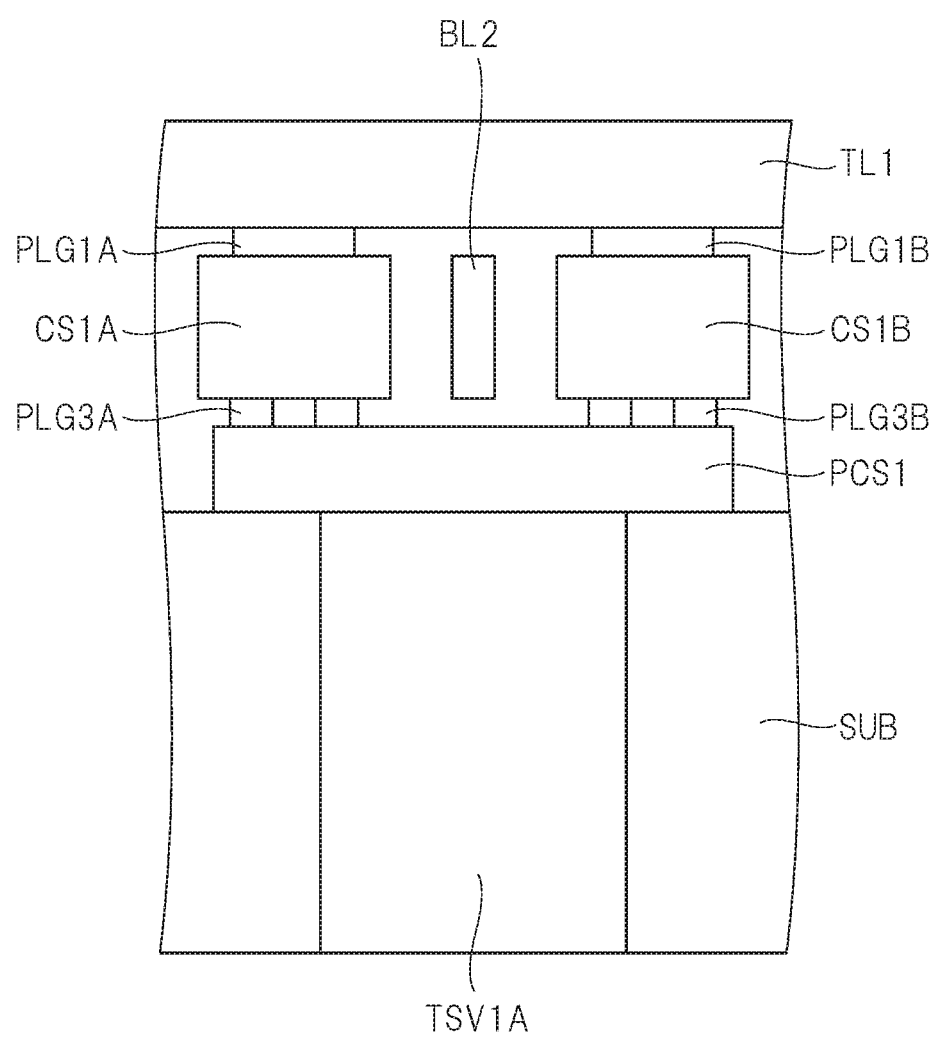
FIG. 23 is a cross-sectional view schematically showing a connection relation among a longitudinal trunk line, a horizontal branch line, a polysilicon connection section, and a through via.

FIGS. 20 to 23 are diagrams illustrating the configuration of the semiconductor device according to the second embodiment. Specifically, FIG. 20 is a plan view showing an arrangement relation between longitudinal trunk lines formed in a second wiring layer (M2 wiring layer) included in a wiring structure formed on a first surface side of a semiconductor substrate and horizontal branch lines formed in a first wiring layer (M1 wiring layer) positioned in a lower layer of the second wiring layer. FIG. 21 is a plan view showing an arrangement relation between the horizontal branch lines formed in the first wiring layer and polysilicon connection sections formed in a lower layer of the first wiring layer. FIG. 22 is a plan view showing an arrangement relation between the polysilicon connection sections and through vias formed to pass through the semiconductor substrate positioned in a lower layer of the polysilicon connection sections. FIG. 23 is a cross-sectional view schematically showing a connection relation among a longitudinal trunk line, a horizontal branch line, a polysilicon connection section, and a through via.

First, in FIG. 20, each of the longitudinal trunk lines TL1 to TL3 is arranged to extend in the y direction, and the longitudinal trunk lines TL1 to TL3 are aligned in the x direction. The longitudinal trunk lines TL1 to TL3 constitute a portion of the wiring structure formed on the first surface side of the semiconductor substrate. Also, the longitudinal trunk lines TL1 to TL3 are electrically connected with power supply mesh wiring (not shown) included in the wiring structure and positioned in an upper layer of the longitudinal trunk lines TL1 to TL3. The power supply mesh wiring is electrically connected with bump electrodes (not shown) mounted on the wiring structure. A power supply potential is supplied to the longitudinal trunk lines TL1 and TL3 configured in such a manner, while a ground potential is supplied to the longitudinal trunk line TL2.

Next, as shown in FIG. 20, the horizontal branch lines BL1 (BL1A, BL1B) and BL2 (BL2A, BL2B) are formed in the first wiring layer (M1 wiring layer) positioned in the lower layer of the second wiring layer (M2 wiring layer) in which the longitudinal trunk lines TL1 to TL3 are formed. Each of the horizontal branch lines BL1 (BL1A, BL1B) and BL2 (BL2A, BL2B) extends in the x direction intersecting the y direction in which each of the longitudinal trunk lines TL1 to TL3 extends. In the first wiring layer (M1 wiring layer), the horizontal branch lines BL1 (BL1A, BL1B) and the horizontal branch lines BL2 (BL2A, BL2B) are arranged so as to alternately align in the y direction. In this case, a power supply potential is supplied to the horizontal branch lines BL1 (BL1A, BL1B), while a ground potential (reference potential) is supplied to the horizontal branch lines BL2 (BL2A, BL2B).

In FIG. 20, the horizontal branch lines BL1A to which a power supply potential is supplied are electrically connected with the longitudinal trunk line TL1 to which a power supply potential is supplied and the longitudinal trunk line TL3 to which a power supply potential is supplied. Specifically, the horizontal branch lines BL1A are connected with connection sections CS1A formed in the first wiring layer (M1 wiring layer), and the connection sections CS1A are electrically connected with the longitudinal trunk lines TL1 and TL3 formed in the second wiring layer (M2 wiring layer) via plugs PLG1A. In this way, the longitudinal trunk line TL1 and the horizontal branch lines BL1A are electrically connected with each other via the connection sections CS1A and the plugs PLG1A. Similarly, the longitudinal trunk line TL3 and the horizontal branch lines BL1A are electrically connected with each other via the connection sections CS1A and the plugs PLG1A.

Also, the horizontal branch lines BL1B are connected with connection sections CS1B formed in the first wiring layer (M1 wiring layer), and the connection sections CS1B are electrically connected with the longitudinal trunk lines TL1 and TL3 formed in the second wiring layer (M2 wiring layer) via plugs PLG1B. In this way, the longitudinal trunk line TL1 and the horizontal branch lines BL1B are electrically connected with each other via the connection sections CS1B and the plugs PLG1B. Similarly, the longitudinal trunk line TL3 and the horizontal branch lines BL1B are electrically connected with each other via the connection sections CS1B and the plugs PLG1B.

In this case, as shown in FIG. 20, spaces are provided between the connection sections CS1A and the connection sections CS1B in a plan view, and the horizontal branch lines BL2 extending in the x direction are arranged in the spaces. In other words, the connection sections CS1A are arranged apart from the connection sections CS1B in a plan view, and the horizontal branch lines BL2 extending in the x direction are arranged between the connection sections CS1A and the connection sections CS1B. In this way, in the second embodiment, the horizontal branch lines BL2 arranged in the positions between the horizontal branch lines BL1A and the horizontal branch lines BL1B extend in the x direction without being divided.

On the other hand, in FIG. 20, the horizontal branch line BL2A to which a ground potential is supplied is electrically connected with the longitudinal trunk line TL2 to which a ground potential is supplied. Specifically, the horizontal branch line BL2A is connected with a connection section CS2A formed in the first wiring layer (M1 wiring layer), and the connection section CS2A is electrically connected with the longitudinal trunk line TL2 formed in the second wiring layer (M2 wiring layer) via a plug PLG2A. In this way, the longitudinal trunk line TL2 and the horizontal branch line BL2A are electrically connected with each other via the connection section SC2A and the plug PLG2A.

Also, the horizontal branch line BL2B is connected with a connection section CS2B formed in the first wiring layer (M1 wiring layer), and the connection section CS2B is electrically connected with the longitudinal trunk line TL2 formed in the second wiring layer (M2 wiring layer) via a plug PLG2B. In this way, the longitudinal trunk line TL2 and the horizontal branch line BL2B are electrically connected with each other via the connection section SC2B and the plug PLG2B.

In this case, as shown in FIG. 20, a space is provided between the connection section CS2A and the connection section CS2B in a plan view, and the horizontal branch line BL1 extending in the x direction is arranged in the space. In other words, the connection section CS2A is arranged apart from the connection section CS2B in a plan view, and the horizontal branch line BL1 extending in the x direction is arranged between the connection section CS2A and the connection section CS2B. In this way, in the second embodiment, the horizontal branch line BL1 arranged in a position between the horizontal branch lines BL2A and BL2B extends in the x direction without being divided.

Next, as shown in FIG. 21, in the lower layer of the connection sections CS1 and CS1B formed in the first wiring layer (M1 wiring layer), polysilicon connection sections PCS1 are arranged. For example, the polysilicon connection sections PCS1 are formed to partially overlap the connection sections CS1A and CS1B arranged in the upper layer in a plan view. In this case, the connection sections CS1A are connected with the polysilicon connection sections PCS1 by a plurality of plugs PLG3A, while the connection sections CS1B are connected with the polysilicon connection sections PCS1 by a plurality of plugs PLG3B. Therefore, a power supply potential is supplied to the polysilicon connection sections PCS1. Similarly, as shown in FIG. 21, in the lower layer of the connection sections CS2A and CS2B formed in the first wiring layer (M1 wiring layer), a polysilicon connection section PCS2 is arranged. For example, the polysilicon connection section PCS2 is formed to partially overlap the connection section CS2A and CS2B arranged in the upper layer in a plan view. In this case, the connection section CS2A is connected with the polysilicon connection section PCS2 by a plurality of plugs PLG4A, while the connection section CS2B is connected with the polysilicon connection section PCS2 by a plurality of plugs PLG4B. Therefore, a ground potential is supplied to the polysilicon connection section PCS2.

Next, as shown in FIG. 22, in the lower layer of the polysilicon connection sections PCS1, through vias TSV1A passing through the semiconductor substrate are formed. For example, the through vias TSV1A are formed to be contained in the polysilicon connection sections PCS1 arranged in the upper layer in a plan view. The through vias TSV1A configured in such a manner are connected with the polysilicon connection sections PCS1. Accordingly, a power supply potential is supplied to the through vias TSV1A.

Similarly, as shown in FIG. 22, in the lower layer of the polysilicon connection section PCS2, a through via TSV1B passing through the semiconductor substrate is formed. For example, the through via TSV1B is formed to be contained in the polysilicon connection section PCS2 arranged in the upper layer in a plan view. The through via TSV1B configured in such a manner is connected with the polysilicon connection section PCS2. Therefore, a ground potential is supplied to the through via TSV1B.

As described above, the wiring structure according to the second embodiment formed on the first surface side of the semiconductor substrate includes the connection sections CS1A that are formed in the same layer as the horizontal branch lines BL1A, are connected with the horizontal branch lines BL1A, are connected with the longitudinal trunk lines TL1 and TL3 by the plurality of plugs PLG1A, and have a portion overlapping the through vias TSV1A in a plan view as shown in, for example, FIGS. 20 to 22.

Furthermore, the wiring structure according to the second embodiment also includes the connection sections CS1B that are formed in the same layer as the horizontal branch lines BL1B, are connected with the horizontal branch lines BL1B, are connected with the longitudinal trunk lines TL1 and TL3 by the plurality of plugs PLG1B, have a portion overlapping the through vias TSV1A in a plan view, and are arranged apart from the connection sections CS1A in the plan view as shown in, for example, FIGS. 20 to 22.

Similarly, the wiring structure according to the second embodiment formed on the first surface side of the semiconductor substrate includes the connection section CS2A that is formed in the same layer as the horizontal branch line BL2A, is connected with the horizontal branch line BL2A, is connected with the longitudinal trunk line TL2 by the plurality of plugs PLG2A, and has a portion overlapping the through via TSV1B in a plan view.

Furthermore, the wiring structure according to the second embodiment also includes the connection section CS2B that is formed in the same layer as the horizontal branch line BL2B, is connected with the horizontal branch line BL2B, is connected with the longitudinal trunk line TL2 by the plurality of plugs PLG2B, has a portion overlapping the through via TSV1B in a plan view, and is arranged apart from the connection section CS2A in a plan view.

Next, in FIG. 23, the through via TSV1A passing through the semiconductor substrate SUB is formed in the semiconductor substrate SUB. Also, on the semiconductor substrate SUB in which the through via TSV1A is formed, the polysilicon connection section PCS1 is formed, and the polysilicon connection section PCS1 is connected with the through via TSV1A. Furthermore, above the polysilicon connection section PCS1, the connection sections CS1A and CS1B spaced apart from each other are arranged. In this case, the connection section CS1A is electrically connected with the polysilicon connection section PCS1 via the plugs PLG3A, and the connection section CS1B is electrically connected with the polysilicon connection section PCS1 via the plugs PLG3B. Note that the horizontal branch line BL2 is arranged between the connection sections CS1A and CS1B spaced apart from each other. In addition, as shown in FIG. 23, above the connection sections CS1A and CS1B spaced apart from each other, the longitudinal trunk line TL1 is arranged. The longitudinal trunk line TL1 and the connection section CS1A are electrically connected with each other via the plug PLG1A, and the longitudinal trunk line TL1 and the connection section CS1B are electrically connected with each other via the plug PLG1B.

Characteristic of the Second Embodiment

Next, the characteristic of the second embodiment will be described. The characteristic of the second embodiment is that spaces are provided between the connection sections CS1A and the connection sections CS1B and the horizontal branch lines BL2 extending in the x direction are arranged in the spaces in a plan view as shown in, for example, FIGS. 20 and 21. Thus, according to the second embodiment, the connection sections CS1A and CS1B spaced apart from each other prevent the horizontal branch lines BL2 from being divided. As a result, according to the characteristic of the second embodiment, it is possible to suppress the side effects caused by the divided horizontal branch lines BL2 from being apparent. Namely, according to the characteristic of the second embodiment, since the horizontal branch lines BL2 are not divided, the side effects of the increase in lengths of the supply paths for supplying a ground potential from the horizontal branch lines BL2 to a part of the standard cells can be suppressed, so that the increase in the wiring resistance due to the increase in the lengths of the supply paths described above can be suppressed. In addition, according to the characteristic of the second embodiment, even when standard cells with a tap-less structure are arranged, it is not necessary to additionally arrange the tap cell for each region where the horizontal branch line BL2 is divided because the horizontal branch line BL2 is not divided, and thus the decrease in arrangement efficiency of the standard cells can be suppressed. As described above, according to the characteristic of the second embodiment, it is possible to achieve the excellent effect that the room for improvement apparent in the related art described above can be overcome.

Third Embodiment

An example of using a bypass wiring to improve heat dissipation efficiency of a base chip will be described in a third embodiment.

Figure 24:
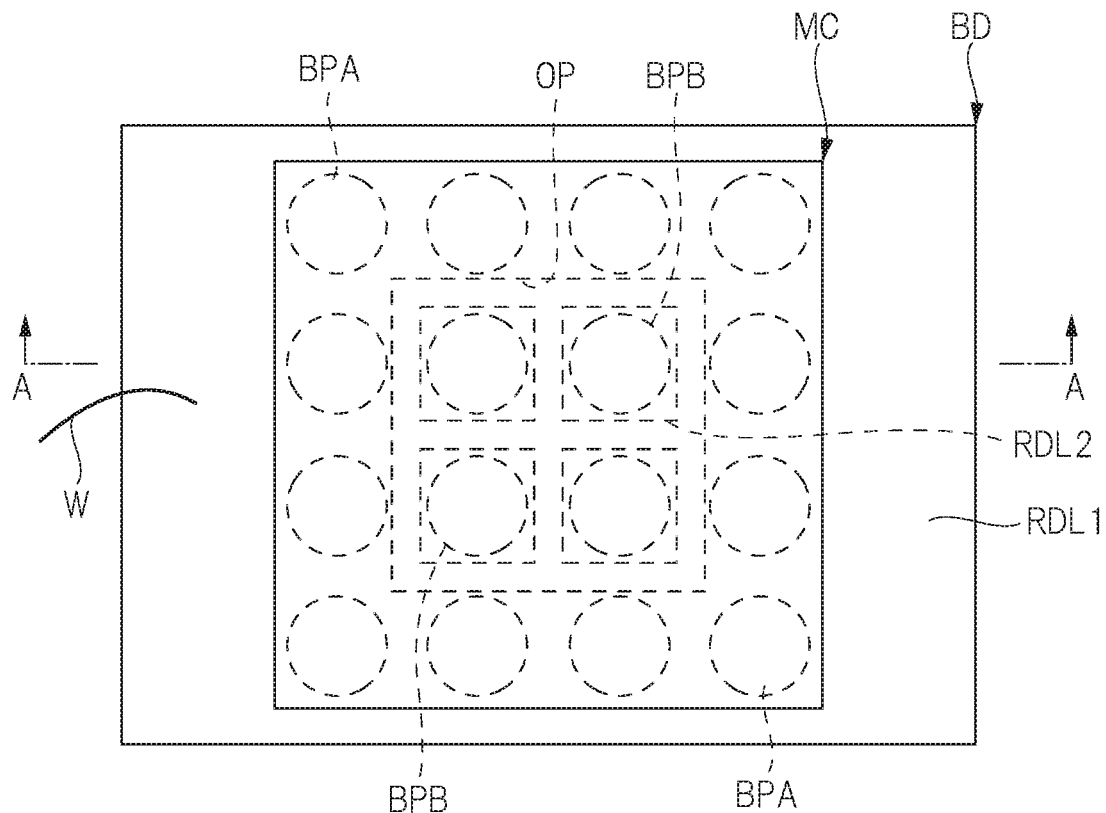
FIG. 24 is a plan view schematically showing a configuration example in which a memory chip is mounted on a base chip according to a third embodiment.

FIG. 24 is a plan view schematically showing a configuration example in which the memory chip MC is mounted on the base chip BD according to the third embodiment. In FIG. 24, a bypass wiring RDL1 and terminals RDL2 arranged in an opening OP provided in the bypass wiring RDL1 are formed on the top surface of the base chip BD. Also, bump electrodes BPA formed on the bottom surface of the memory chip MC are connected with the bypass wiring RDL1, and bump electrodes BPB formed on the bottom surface of the memory chip MC are connected with the terminals RDL2. In addition, the plane size of the base chip BD is greater than that of the memory chip MC, and a wire W is connected with the bypass wiring RDL1 formed on the top surface of the base chip BD.

Figure 25:
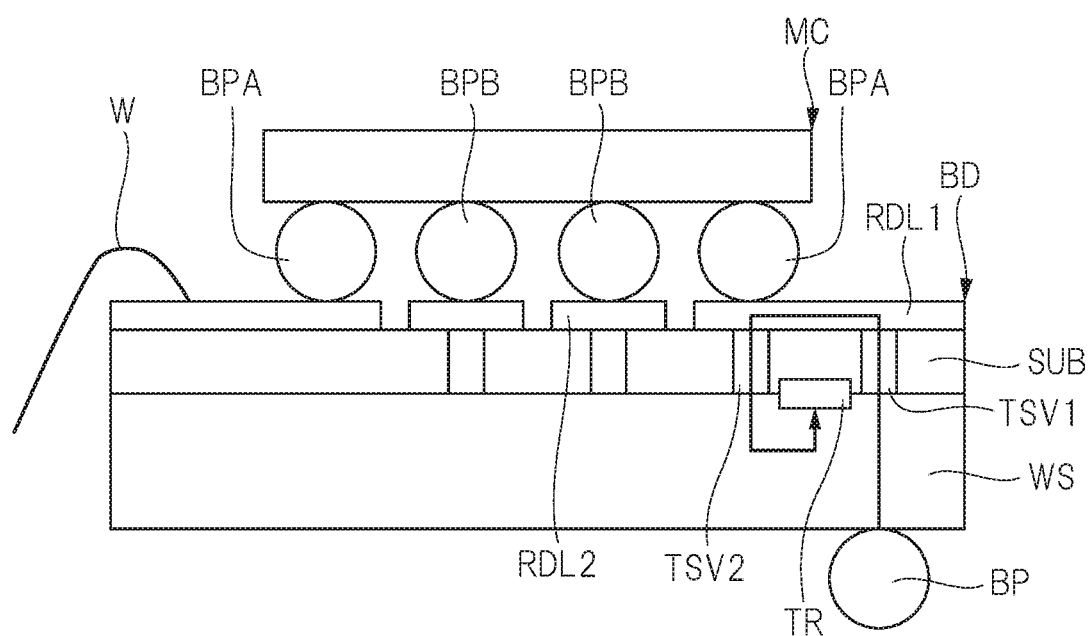
FIG. 25 is a cross-sectional view taken along a line A-A in FIG. 24.

FIG. 25 is a cross-sectional view taken along a line A-A in FIG. 24. In FIG. 25, a transistor TR, a wiring structure WS formed on the bottom surface of the semiconductor substrate SUB, a bump electrode BP connected with the wiring structure WS, through vias TSV1 and TSV2 passing through the semiconductor substrate SUB, and the bypass wiring RDL1 and the terminals RDL2 formed on the top surface of the semiconductor substrate SUB are formed in the base chip BD. In this case, the bypass wiring RDL1 is connected with the through via TSV1 as well as the through via TSV2. Also, the memory chip MC with a plane size smaller than that of the base chip BD is mounted above the base chip BD. Specifically, the bump electrodes BPA mounted on the bottom surface of the memory chip MC are connected with the bypass wiring RDL1 formed on the top surface of the base chip BD, and the bump electrodes BPB mounted on the bottom surface of the memory chip MC are connected with the terminals RDL2 formed on the top surface of the base chip BD.

In the base chip BD configured in such a manner, the bump electrode BP and the transistor TR are electrically connected with each other via the wiring structure WS, the through via TSV1, the bypass wiring RDL1, and the through via TSV2 (see the arrow). Namely, the bypass wiring RDL1 constitutes a portion of a connection path for connecting the bump electrode BP with the transistor TR.

The characteristic of the third embodiment is that the bypass wiring RDL1 functions as a dissipation path of heat generated from the transistor TR as shown in, for example, FIG. 25. Namely, in the base chip BD according to the third embodiment, the heat generated from the transistor TR is transferred to the bypass wiring RDL1 via the through vias TSV1 and TSV2 and is dissipated from the surface of the bypass wiring RDL1. In this way, the heat generated from the transistor TR can be dissipated from the surface of the bypass wiring RDL1 in the base chip BD according to the third embodiment, and thus an increase in temperature of the base chip BD due to the heat generation from the transistor TR can be suppressed. Furthermore, in the third embodiment, the wire W is connected with the bypass wiring RDL1 as shown in, for example, FIG. 25. Accordingly, the heat transferred from the transistor TR to the bypass wiring RDL1 can be efficiently dissipated not only from the surface of the bypass wiring RDL1, but also from the wire W made of metal with heat conductivity higher than that of resin. Thus, according to the third embodiment, it is possible to efficiently dissipate the heat generated from the transistor TR formed in the base chip BD to the outside of the base chip BD. Therefore, according to the third embodiment, malfunction and thermal runaway of the transistor TR due to the increase in temperature of the base chip BD can be suppressed, so that the reliability of the semiconductor device including the base chip BD can be enhanced.

In the foregoing, the invention made by the inventor of the present invention has been concretely described based on the embodiments. However, it is needless to say that the present invention is not limited to the foregoing embodiments and various modifications and alterations can be made within the scope of the present invention.

In the foregoing embodiments, the technical ideas of the embodiments have been described while taking a base chip as an example, but the technical ideas of the embodiments are widely applicable to semiconductor devices including a semiconductor chip having through vias other than the base chip.

What is claimed is:

1. A semiconductor device comprising:
a semiconductor substrate having a first surface and a second surface, the second surface being positioned on an opposite side of the first surface;
a first wiring and a second wiring each formed on the first surface side of the semiconductor substrate;
a bypass wiring formed on a second surface side of the semiconductor substrate;
a first through via passing through the semiconductor substrate and electrically connected with the first wiring; and
a second through via passing through the semiconductor substrate, electrically connected with the second wiring, and arranged in a position different from the first through via,
wherein the bypass wiring is connected with the first through via and the second through via,
wherein the first wiring and the second wiring are included in a wiring structure formed on the first side of the semiconductor substrate, and
wherein a sheet resistance value of the bypass wiring is smaller than a sheet resistance value of wiring included in the wiring structure.

2. The semiconductor device according to claim 1, wherein the bypass wiring is power supply wiring.

3. The semiconductor device according to claim 1,
wherein the wiring structure includes:
a first wiring structure formed in a first region; and
a second wiring structure formed in a second region,
wherein the first wiring structure includes the first wiring,
wherein the second wiring structure includes the second wiring,
wherein the first through via is connected with the first wiring structure, and
wherein the second through via is connected with the second wiring structure.

4. The semiconductor device according to claim 3,
wherein the first wiring structure includes a power supply wiring structure to which a first power supply potential is supplied,
wherein the second wiring structure includes:
a first power supply wiring structure to which the first power supply potential is supplied; and
a second power supply wiring structure to which a second power supply potential different from the first power supply potential is supplied, and
wherein the bypass wiring electrically connects the power supply wiring structure with the first power supply wiring structure.

5. The semiconductor device according to claim 4,
wherein the first region is a region where a standard cell to which the first power supply potential is supplied is formed, and
wherein the second region is a region where a standard cell to which the first power supply potential is supplied and a macro to which the second power supply potential is supplied are formed.

6. The semiconductor device according to claim 1,
wherein the wiring structure includes:
a first wiring structure formed in a first region;
a second wiring structure formed in a second region; and
a third wiring structure formed in a third region,
wherein the first region is a region where a standard cell to which a first power supply potential is supplied and a PLL circuit to which a fourth power supply potential is supplied are formed,
wherein the second region is a region where a standard cell to which the first power supply potential is supplied and a macro to which a second power supply potential is supplied are formed,
wherein the third region is a region where a voltage conversion circuit that generates the fourth power supply potential from a third power supply potential is formed,
wherein the first through via is electrically connected with the PLL circuit, wherein the second through via is electrically connected with the voltage conversion circuit, and
wherein the bypass wiring connects the PLL circuit with the voltage conversion circuit.

7. A semiconductor device comprising:
a semiconductor substrate having a first surface and a second surface, the second surface being positioned on an opposite side of the first surface;
a first wiring and a second wiring each formed on the first surface side of the semiconductor substrate;
a bypass wiring formed on a second surface side of the semiconductor substrate;
a first through via passing through the semiconductor substrate and electrically connected with the first wiring; and
a second through via passing through the semiconductor substrate, electrically connected with the second wiring, and arranged in a position different from the first through via,
wherein the bypass wiring is connected with the first through via and the second through via,
wherein the first wiring and the second wiring are included in a wiring structure formed on the first side of the semiconductor substrate, and
wherein the wiring structure includes:
 a global wiring layer including a third wiring with a smallest sheet resistance value;
 a semi-global wiring layer including a fourth wiring with a sheet resistance value greater than the sheet resistance value of the third wiring; and
 a local wiring layer including third wiring with a sheet resistance value greater than the sheet resistance value of the fourth wiring.

8. The semiconductor device according to claim 7,
wherein the wiring structure includes:
 a first wiring structure formed in a first region; and
 a second wiring structure formed in a second region,
wherein the first through via is connected with the first wiring structure,
wherein the second through via is connected with the second wiring structure,
wherein the first region is a region where a standard cell to which a first power supply potential is supplied is formed,
wherein the second region is a region where a standard cell to which the first power supply potential is supplied and a macro to which a second power supply potential is supplied are formed, and
wherein the second wiring included in the semi-global wiring layer is interposed in an electrical connection path between the second through via and the standard cell formed in the second region.

9. The semiconductor device according to claim 7,
wherein the wiring structure includes:
 a first wiring structure formed in a first region; and
 a second wiring structure formed in a second region,
wherein the first through via is connected with the first wiring structure,
wherein the second through via is connected with the second wiring structure,
wherein the first region is a region where a standard cell to which a first power supply potential is supplied is formed,
wherein the second region is a region where a standard cell to which the first power supply potential is supplied and a macro to which a second power supply potential is supplied are formed, and
wherein the second through via and the standard cell formed in the second region are electrically connected only by the third wiring included in the local wiring layer.

10. The semiconductor device according to claim 1,
wherein the semiconductor device is a semiconductor chip,
wherein the semiconductor chip has a first bump electrode that is formed on the wiring structure and is electrically connected with the wiring structure, and
wherein the bypass wiring is configured to be connectable with a second bump electrode that is formed in another semiconductor chip arranged in a laminated manner on the semiconductor chip.

11. The semiconductor device according to claim 8,
wherein the bypass wiring is connected with a wire.

12. The semiconductor device according to claim 1,
wherein the wiring structure includes:
 a first trunk line which extends in a first direction in a plan view and to which a first potential is supplied; and
 a branch line structure positioned in a lower layer of the first trunk line and extending in a second direction intersecting the first direction in a plan view,
wherein the branch line structure includes:
 a first branch line to which the first potential is supplied;
 a second branch line to which a second potential is supplied and which is positioned next to the first branch line; and
 a third branch line to which the first potential is supplied and which is positioned next to the second branch line,
wherein the wiring structure further includes:
 a first connection structure which is formed in the same layer as the first branch line and the third branch line, is connected with the first branch line, is connected with the first trunk line by a plurality of first plugs, and has a portion overlapping the first through via in a plan view; and
 a second connection structure which is formed in the same layer as the first branch line and the third branch line, is connected with the third branch line, is connected with the first trunk line by a plurality of second plugs, has a portion overlapping the first through via in a plan view, and is arranged apart from the first connection structure via a space in a plan view, and
wherein the second branch line is arranged in the space.

13. The semiconductor device according to claim 12,
wherein the first potential is a power supply potential, and
wherein the second potential is a reference potential.

14. The semiconductor device according to claim 12,
wherein the first potential is a reference potential, and
wherein the second potential is a power supply potential.

* * * * *